United States Patent [19]

Noren et al.

[11] Patent Number: 5,334,456
[45] Date of Patent: Aug. 2, 1994

[54] FREE-RADICAL CURABLE COMPOSITIONS

[75] Inventors: Gerry K. Noren, Hoffman Estates; John J. Krajewski, Wheeling; Sami A. Shama; John M. Zimmerman, both of Hoffman Estates; Danny C. Thompson, Schaumburg; John T. Vandeberg, Barrington, all of Ill.

[73] Assignee: Stamicarbon B.V., Galeen, Netherlands

[21] Appl. No.: 888,919

[22] Filed: May 26, 1992

Related U.S. Application Data

[63] Continuation-in-part of Ser. No. 647,492, Jan. 28, 1991, abandoned, which is a continuation-in-part of Ser. No. 437,374, Nov. 15, 1989, abandoned, and a continuation-in-part of Ser. No. 647,514, Jan. 28, 1991, abandoned, which is a continuation-in-part of Ser. No. 438,540, Nov. 15, 1989, abandoned, and a continuation-in-part of Ser. No. 647,460, Jan. 28, 1991, abandoned, which is a continuation-in-part of Ser. No. 436,826, Nov. 15, 1989, abandoned, which is a continuation-in-part of Ser. No. 404,578, Sep. 8, 1989, abandoned, which is a continuation-in-part of Ser. No. 319,566, Mar. 7, 1989, abandoned, which is a continuation-in-part of Ser. No. 231,362, Aug. 12, 1988, abandoned.

[51] Int. Cl.$^5$ .................. B32B 27/06; B32B 27/36; C08F 2/50; C08F 16/32
[52] U.S. Cl. .................. 428/431; 428/458; 428/480; 428/481; 428/482; 428/492; 522/40; 522/41; 522/42; 522/43; 522/44; 522/64; 522/179; 522/181; 522/107; 526/323; 526/332; 526/333
[58] Field of Search .................. 522/93, 97, 96, 174, 522/179, 181, 44, 64, 40, 41, 42, 43, 44, 107; 428/431, 458, 480, 81, 482, 492; 526/323, 332, 333

[56] References Cited

U.S. PATENT DOCUMENTS

| | | | |
|---|---|---|---|
| 2,255,313 | 9/1941 | Ellis | 260/42 |
| 4,112,146 | 9/1978 | Lazear | 428/290 |
| 4,131,529 | 12/1978 | Osterloh et al. | 522/179 |
| 4,200,762 | 4/1980 | Schmidle | 528/75 |
| 4,447,520 | 5/1984 | Henne et al. | 430/281 |
| 4,552,830 | 11/1985 | Reardon et al. | 430/281 |
| 4,585,828 | 4/1986 | Meixner et al. | 524/604 |
| 4,606,994 | 8/1986 | Illers et al. | 30/281 |
| 4,721,734 | 1/1988 | Gehlhaus et al. | 522/8 |
| 4,749,807 | 6/1988 | Lapin et al. | 521/172 |
| 4,751,273 | 6/1988 | Lapin et al. | 522/174 |

FOREIGN PATENT DOCUMENTS 0322808 1/1989 European Pat. Off. .

*Primary Examiner*—Susan W. Berman
*Attorney, Agent, or Firm*—Dressler, Goldsmith, Shore & Milnamow, Ltd.

[57] ABSTRACT

A free-radical radiation curable composition comprising:
a) at least one compound containing from one to about six vinyl ether groups; and
b) at least one compound containing a saturated backbone and at least one maleate or fumarate end group per molecule,
wherein the ratio of vinyl ether groups to maleate or fumarate groups in the composition is in the range of about 5:1 to about 1:5.

26 Claims, No Drawings

FREE-RADICAL CURABLE COMPOSITIONS

CROSS-REFERENCE TO RELATED APPLICATIONS

This application is a continuation-in-part of U.S. application Ser. No. 647,492, filed Jan. 28, 1991 which is a continuation-in-part of U.S. application Ser. No. 437,374, filed Nov. 15, 1989, U.S. application Ser. No. 647,514, filed Jan. 28, 1991, which is a continuation-in-part of U.S. application Ser. No. 438,540, filed Nov. 15, 1989, and U.S. application Ser. No. 647,460, filed January 28, 1991, which is a continuation-in-part of U.S. application Ser. No. 436,826, filed Nov. 15, 1989, each of which is a continuation-in-part of U.S. application Ser. No. 404,578, filed Sep. 8, 1989 which is a continuation-in-part of U.S. application Ser. No. 319,566, filed Mar. 7, 1989 which is a continuation-in-part of U.S. application Ser. No. 231,362 filed Aug. 12, 1988 all abandoned.

TECHNICAL FIELD

This invention is directed to free-radical curable compositions that are useful as coatings for various substrates.

BACKGROUND OF THE INVENTION

There are many applications that require a rapidly curable coating composition that adheres to a substrate, is flexible, does not discolor and has low toxicity. For example, optical glass fibers are frequently coated with two superposed coatings. The coating which contacts the glass is a relatively soft, primary coating that must satisfactorily adhere to the fiber and be soft enough to resist microbending especially at low service temperatures. The outer, exposed coating is a much harder secondary coating that provides the desired resistance to handling forces yet must be flexible enough to enable the coated fiber to withstand repeated bending without cracking the coating.

Other applications, e.g., optical fabrication, coatings for substrates including glass, metal, wood, plastic, rubber, paper, concrete, and fabrics, and adhesives also require compositions that are fast curing, have low toxicity and provide good physical properties.

Compositions that include (meth)acrylate diluents have been utilized for many of these applications. However, (meth) acrylate diluents are hazardous to human health. Therefore, it is desirable to eliminate or reduce the amount of (meth)acrylate diluents present in a composition.

Vinyl ether compositions have been utilized as replacements for (meth)acrylates. Although vinyl ethers rapidly cure when exposed to ultraviolet light in the presence of a cationic curing catalyst, their cure under cationic conditions leaves catalyst residues that discolor the cured compositions and cause them to be sensitive to water. Furthermore, vinyl ether containing oligomers having relatively high equivalent weights, e.g., an equivalent weight in excess of about 500, Go not cationically cure upon exposure to dosages of energy less than 3 Joules per square centimeter. Vinyl ethers do not homopolymerize in the presence of free radical initiators- Therefore, vinyl ethers are not suitable replacements for (meth) acrylates.

Unsaturated polyesters, e.g., maleates and fumarates, are known to be substantially non-toxic, but are unsatisfactory as replacements for (meth) acrylates because their rate of cure when exposed to ultraviolet light is not satisfactory for certain applications.

European Patent Application No. 0 322 808 published on 05.07.89 discloses a radiation curable composition that comprises an ethylenically unsaturated polyester component and a vinyl ether component having an average of at least two vinyl ether groups per molecule of the vinyl ether component. The unsaturated polyester component can be a polymer, oligomer or mixture thereof. Coatings produced from this composition are brittle and hard because of the large amount of ethylenically unsaturated groups in the backbone of the polyester component which leads to short chain segments between cross-links. The vinyl ether component reacts with the ethylenically unsaturated group and results in a high degree of cross-linking that causes the cured composition to be brittle, inflexible and hard. Thus, coatings produced from the composition of this European Patent Application do not possess the needed flexibility and softness for applications, such as optical glass fiber coatings, that require a flexible and soft coating.

SUMMARY OF THE INVENTION

This invention is directed to free-radical radiation curable compositions that comprise (1) at least one compound containing from one to about six vinyl ether groups, and (2) at least one compound containing a saturated backbone and at least one maleate and/or fumarate end group per molecule, wherein the ratio of vinyl ether groups to maleate and/or fumarate groups is in the range of about 5:1 to about 1:5.

These compositions exhibit low toxicity, good cure speeds, good physical properties and are readily synthesized and economical to produce.

The present invention is also directed to novel compounds. These compounds can be incorporated in the compositions of the present invention. These compounds are represented by the Formula I:

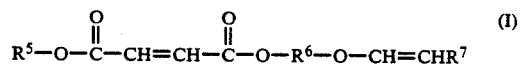

where $R^5$ is hydrogen, alkyl, cycloalkyl, an aryl or alkaryl group with 1 to 10 carbon atoms and at least one optional O or N heteroatom, or a metal ion; $R^6$ is alkyl, cycloalkyl, or an aryl or alkaryl group with 1 to 10 carbon atoms and at least one optional O or N heteroatom; and $R^7$ is hydrogen or methyl.

These compounds can be polymerized to give homopolymers, copolymers or random polymers with other monomers by conventional polymerization techniques. However, it is preferred to formulate these compounds in the compositions of the present invention.

The compositions of the present invention can, optionally, contain up to about 50% by weight of at least one (meth)acrylate oligomer.

The compositions of the present invention are curable upon exposure to ionizing radiation, actinic energy and heat. The cured compositions exhibit good flexibility, tensile strength, percent elongation and adhesion to substrates. These properties are presently believed to be due to the presence of the saturated backbones in the compound having maleate or fumarate end groups. Prior art coatings produced from materials having meleate/fumarate unsaturated backbones tend to be brittle and hard.

Suitable uses for these flexible compositions include optical glass fiber coatings, paper coatings, leather coatings, wood coatings, concrete coatings, fabric coatings, metal coatings, coatings for the metallization of non-metallic substrates, e.g., plastics, coatings for rubber, optical fabrication, lamination of glass and other materials, i.e., composites, dentistry, prosthetics, adhesives, and the like.

The coatings produced from the present compositions are especially useful as primary and secondary coatings for optical glass fibers because of their adherence to the glass, relatively rapid cure, cure to a relatively fully cured condition without the need for post-curing, flexibility, and resistance to microbending.

Even when the compound containing the vinyl ether group has an equivalent weight in excess of about 500, compositions of the present invention that contain the vinyl ether containing compound are curable by a free-radical mechanism. Cationic curing of these vinyl ether oligomers is not practical.

Thus, the present invention provides compositions having many properties desired by industry while overcoming the shortcomings of the prior art.

DETAILED DESCRIPTION OF PREFERRED EMBODIMENTS

The present invention is directed to free-radical radiation curable compositions that comprise (1) at least one compound containing from one to about six vinyl ether groups; and (2) at least one compound containing a saturated backbone and at least one maleate and/or fumarate end group per molecule, wherein the ratio of vinyl ether groups to maleate and/or fumarate groups in the compositions is in the range of about 5:1 to about 1:5, preferably in the range of about 2:1 to about 1:2 and more preferably about 1:1.

Vinyl Ether Containing Compound

The term "vinyl ether", in its various grammatical forms, refers to a vinyl group bound to an oxygen atom which is bound to a carbon atom.

Preferred compounds containing at least one vinyl ether group have the Formula II:

$$R^3-(O-CH=CHR^4)_m \qquad (11)$$

where m is an integer from 1 to 5;

$R^3$ is a residue of an organic alcohol or polyol, substantially free of maleate or fumarate groups, with a molecular weight of from 56 to about 2000; and $R^4$ is hydrogen or methyl.

In the most preferred vinyl ether compounds m is 2 to 4.

Preferred vinyl ether compounds are triethylene glycol divinyl ether, commercially available from ISP Corp. under the trade designation Rapi-Cure DVE-3, butane diol divinyl ether, 1,4-cyclohexane dimethanol divinyl ether, octyl vinyl ether, the like, and mixtures thereof.

Other vinyl ether containing compounds can be produced by conventionally reacting a vinyl ether having either a hydroxyl group or amine group with a saturated backbone containing component. The saturated backbone containing component may be the reaction product of saturated hydroxy functional polyesters, polycarbonates, polycaprolactones, polyethers, Bisphenol-A alkoxylates, siloxanes, or polyethers, with organic polyisocyanates, the like and mixtures thereof. The backbone of the vinyl ether containing compound can contain repeating units. The group linking the vinyl ether group to the saturated backbone (linking group) can be a urethane, urea, ester, ether, or thio group and the like. Preferred linking groups are urethane, urea and ester groups. Mixtures of linking groups can be used.

Representative of the vinyl ethers suitable as reactants in the production of the vinyl ether containing oligomer are conventional hydroxy functional vinyl ethers including triethylene glycol monovinyl ether, 1,4-cyclohexane dimethylol monovinyl ether and 4-hydroxy butylvinyl ether.

Representative of the saturated polyesters are the soluble reaction products of saturated polycarboxylic acids, or their anhydrides, and polyols, preferably diols. Suitable saturated polycarboxylic acids and anhydrides include phthalic acid, isophthalic acid, terephthalic acid, trimellitic acid, tetrahydrophthalic acid, hexahydrophthalic acid, tetrachlorophthalic acid, adipic acid, azelaic acid, sebacic acid, succinic acid, glutaric acid, malonic acid, pimelic acid, suberic acid, 2,2-dimethylsuccinic acid, 3,3-dimethylglutaric acid, 2,2-dimethylglutaric acid, the like, anhydrides thereof and mixtures thereof. Suitable polyols include 1,4-butane diol, 1,8-octane diol, trimethylol propane, pentaerythritol, and the like.

Representative of the saturated polycarbonates are polyhexamethylene carbonate commercially available from PPG Industries under the trade designation Duracarb 120 and polycyclohexane dimethylene carbonate commercially available from PPG Industries under the trade designation Duracarb 140.

Representative of the saturated polyethers are polyalkylene oxides, alkyl substituted poly(tetrahydrofurans), and copolymers of the alkyl substituted tetrahydrofurans and a cyclic ether.

Representative of the polyalkylene oxides are poly(propylene oxide), commercially available from Union carbide under the trade designation Niax PPG 1025 and poly(tetramethylene glycol), commercially available from DuPont under the trade designation Terathane 1000.

Alkyl substituted tetrahydrofurans have ring structures that open during polymerization to yield the alkyl substituted poly(tetrahydrofurans). The alkyl group of the alkyl substituted poly(tetrahydrofurans) has about 1 to about 4 carbon atoms. Representative of the alkyl substituted poly(tetrahydrofurans) are poly(2-methyltetrahydrofuran) and poly(3-methyltetrahydrofuran). Representative of the cyclic ethers with which the alkyl substituted tetrahydrofurans can be copolymerized are ethylene oxide, propylene oxide, tetrahydrofuran and the like.

Representative of the polycaprolactones are the Tone Polyol series of products, e.g., Tone 0200, 0221, 0301, 0310, 2201, and 2221, commercially available from Union Carbide, New York, N.Y. Tone Polyol 0200, 0221, 2201, and 2221 are difunctional. Tone Polyol 0301 and 0310 are trifunctional.

Representative of the Bisphenol-A alkoxylates are those wherein the hydroxy alkyl group contains about 2 to about 4 carbon atoms, e.g., hydroxyethyl. A commercial Bisphenol-A alkoxylate is the Bisphenol-A diethoxylate available under the trade designation Dianol 22 from Akzo Research, The Netherlands.

Representative of the siloxanes is poly(dimethylsiloxane) commercially available from Dow Corning under the trade designation DC 193.

Suitable vinyl ether containing compounds can also be prepared by the procedures disclosed in U.S. Pat. No. 4,996,282.

Further examples of suitable vinyl ether containing compounds are polyvinyl ether polyurethanes and saturated polyesters such as those shown in U.S. Pat. Nos. 4,472,019, 4,749,807, 4,751,273, and 4,775,732.

Further representative vinyl ether containing compounds are obtained by the metathesis of a cyclic olefin ether having the following general Formula III:

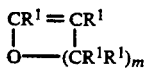
(III)

wherein each $R^1$ individually can be hydrogen, an alkyl, aryl, cycloaliphatic or halogen group and m is a number in the range of about 2 to about 10, preferably about 5 to about 6. Metathesis, which is described in March, Advanced Organic Chemistry, Third Edition, copyright 1985 by John Wiley & Sons, Inc., pp 1036-1039 & 1115, results in the opening of the ring of the cyclic olefin ether to produce a vinyl ether containing compound having the following general Formula IV:

$$Z \text{---}(CR^1R^1)_m\text{---}O\text{---}CR^1\text{=}CR^1 \text{---}_y Z \qquad (IV)$$

wherein $R^1$ and m are as previously described, y is a number in the range of about 2 to about 50, preferably about 2 to about 25, and each Z is an end group; e.g., hydrogen, a vinyl group. The vinyl ether containing compounds of Formula IV can be blended with the other vinyl ether containing compounds of the present invention or those disclosed in U.S. Pat. Nos. 4,472,019, 4,749,807, 4,751,273, and 4,775,732.

The vinyl ether containing compounds generally have a number average molecular weight of from about 150 to about 8000, preferably from about 150 to about 3000 and most preferably from about 200 to about 2000.

When the compositions of the present invention are utilized as a primary coating for optical glass fiber the equivalent weight of the vinyl ether containing compounds is preferably about 500 to about 1500, more preferably about 800 to about 1200.

When the compositions of the present invention are utilized as a secondary coating for optical glass fiber the equivalent weight of the vinyl ether containing compounds is preferably about 300 to about 1,000, more preferably about 400 to about 800.

Maleate and/or Fumarate Containing

Preferred compounds that have a saturated backbone and at least one maleate or fumarate end group per molecule have the Formula V:

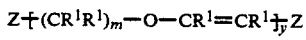
(V)

where n is an integer from 1 to 5; $R^1$ is the residue of an organic alcohol or polyol, substantially free of maleate, fumarate, or urethane groups, with a molecular weight of from 14 to about 2000; and $R^2$ is hydrogen, alkyl, cycloalkyl, an aryl or alkaryl, with 1 to 15 carbon atoms and at least one optional O or N heteroatom, or a metal ion.

More preferred compounds are those of the above formula wherein n is 2 to 4, $R^2$ is

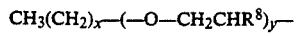

where X is 0 to 5; Y is 0 to 3; and $R^8$ is hydrogen or methyl and those compounds wherein n is 2 and

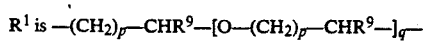

where p is an integer from 1 to 5; q is an integer from 0 to 20; and $R^9$ is hydrogen or methyl.

It is well known that maleate groups isomerize to fumarate groups. Therefore, it is likely that a mixture of maleate and fumarate groups will be present in most of these compounds.

The saturated polyester having maleate or fumarate end groups is the reaction product of a saturated polyester backbone containing component and a maleate or fumarate end group containing component.

The saturated polyester backbone containing component can be represented by hydroxy functional saturated dicarboxylates, polycarbonates, polycaprolactones and the like.

The hydroxy functional saturated dicarboxylates can be the reaction product of an aforementioned saturated dicarboxylic acid and an aforementioned polyhydric alcohol.

Commercially available polycarbonates include the aforementioned Duracarb products commercially available from PPG Industries and Duracarb 124 also commercially available from PPG Industries.

Commercially available polycaprolactones include the aforementioned Tone Polyol series of products commercially available from Union Carbide.

The saturated polyester backbone containing component is reacted with a maleate and/or fumarate containing component obtainable by the reaction of maleic and/or fumaric acid, or anhydride, and a monohydric alcohol or a cyclic ether.

Representative of the monohydric alcohols are the $C_1$ to $C_{15}$ alcohols, e.g., ethanol, decanol, the like and mixtures thereof.

Alternatively, these compositions can be prepared by the reaction of a polyol with maleic anhydride to form a carboxy terminated oligomer that subsequently is reacted with propylene oxide or ethylene oxide.

The number average molecular weight of the saturated polyester is preferably about 100 to about 5000.

The equivalent weight of the saturated polyester is preferably about 50 to about 10,000, more preferably about 50 to about 1,000.

Optional (Meth)acrylate Component (Meth) acrylate monomers and oligomers may be used in the compositions of this invention. These (meth) acrylate monomers and oligomers also polymerize by free radical radiation and copolymerize with the other components of the compositions of the present invention. The (meth) acrylate monomers and oligomers can be present in amounts up to 50% by weight of the compositions and preferably have equivalent weights ranging from about 250 to 5000 and average functionalities from about 1 to 4. Higher molecular weight (meth)acrylates are preferred because they are less toxic.

The term "(meth)acrylate", and various grammatical forms thereof, identifies esters that are the reaction product of acrylic or methacrylic acid with a hydroxy group-containing compound.

The (meth)acrylate oligomers suitable for use in the present invention contain an average of at least 1.0, preferably at least about 1.2, and more preferably about 2 to about 4, (meth) acrylate groups per oligomer.

These (meth)acrylate oligomers are illustrated by Cargill 1570, a diacrylate ester of Bisphenol A epichlorohydrin epoxide resin having a number average molecular weight of about 700 daltons that is commercially available from Cargill, Carpentersville, Ill.

The (meth) acrylate oligomer can be a poly(meth)acrylate of an epoxy functional resin. These poly(meth)acrylates preferably contain an average of more than about two (meth)acrylate groups per oligomer and are exemplified by the commercial product Ebecryl 3700 available from Radcure Specialties, Inc., Louisville, Ky., which is the diester of Epon 828 and acrylic acid. Epon 828 is an epoxy functional resin that is a diglycidyl ether of Bisphenol A that is commercially available from Shell Chemicals, New York, N.Y. The number average molecular weight of Novacure 3700 is about 500 daltons and of Epon 828 is about 390 daltons.

(Meth) acrylate-modified polyurethanes are also useful as the (meth)acrylate oligomers, especially those that employ a polyester base. Particularly preferred are acrylate-capped polyurethanes that are the urethane reaction products of a hydroxy-functional polyester, especially one having an average of about 2 to about 5 hydroxy groups per molecule, with a monoacrylate monoisocyanate. These acrylate-capped polyurethanes are illustrated by a polyester made by reacting trimethylol propane with a caprolactone to a number average molecular weight of about 600 daltons followed by reaction with three molar proportions of the reaction product of 1 mol of 2-hydroxyethyl acrylate with 1 mol of isophorone diisocyanate. The end product is a polyurethane triacrylate. The urethane-forming reaction is conventionally performed at about 60° C. in the presence of about 1 percent by weight of dibutyltin dilaurate.

A commercial, polyester-based polyacrylate-modified polyurethane that is useful herein is Uvithane 893 available from Thiokol Chemical Corp., Trenton, N.J. The polyester in the Uvithane 893 product is a polyester of adipic acid with about 1.2 molar proportions of ethylene glycol polyesterified to an acid number of less than about 5. This polyester is converted as described above to a polyacrylate-modified polyurethane that is a semisolid at room temperature and that has an average unsaturation equivalent of about 0.15 to about 0.175 acrylic double bonds per 100 grams of resin.

In polyester processing, the acid number, defined as the number of milligrams of potassium hydroxide required to neutralize one gram of polyester, is used to monitor the progress of the reaction. The lower the acid number, the further the reaction has progressed.

A polyacrylate-modified polyurethane that is suitable as the (meth) acrylate oligomer is the reaction product of 1 mol of diisocyanate, 1 mol of 2-hydroxyethyl acrylate (HEA) and about 1 weight percent dibutyltin dilaurate reacted at a temperature of about 40° C. for a time period of 4 hours that is subsequently reacted at a temperature of about 60° C. for a time period of about 2 hours with 1 mol of a commercial hydroxy end-functional caprolactone polyester. A suitable caprolactone polyester is the reaction product of 2 mols caprolactone and 1 mol of ethylene glycol reacted at a temperature of about 60° C. for a time period of 4 hours. A suitable commercial caprolactone polyester is available from Union Carbide Corp., Danbury, Conn., under the trade designation Tone M-100 which has a number average molecular weight of about 345 daltons.

The number average molecular weight of the (meth) acrylate oligomers is preferably about 500 to about 15,000, more preferably about 1,200 to about 6,000, daltons.

The equivalent weight of the (meth)acrylate oligomers is preferably about 250 to about 5,000, more preferably about 600 to about 3,000.

Conventional Diluent

Other monomers that are known to be used in free radical curable compositions such as N-vinyl pyrrolidinone, N-vinyl imidazole, 2-vinylpyridine, N-vinyl carbazole, N-vinyl caprolactam, the like, and mixtures thereof can be added to the composition of the present invention.

Compounds Containing Vinyl Ether and Maleate and/or Fumarate Groups

The present invention is also directed to novel compounds and the use of these compounds in compositions including the compositions of the present invention. The compounds can be utilized in the compositions of the present invention. These compounds can be represented by the following Formula I:

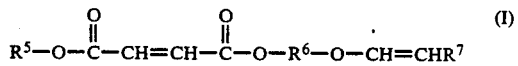

where $R^5$ is hydrogen, alkyl, cycloalkyl, an aryl or alkaryl group with 1 to 10 carbon atoms and at least one optional O or N heteroatom, or a metal ion; $R^6$ is alkyl, cycloalkyl, or an aryl or alkaryl group with 1 to 10 carbon atoms and at least one optional O or N heteroatom; and $R^7$ is hydrogen or methyl.

These compounds can homopolymerize in the presence of conventional free-radical initiators or acidic catalysts. Alternatively, these compounds can be utilized in compositions that include other monomers and oligomers to produce alternating copolymers and random copolymers.

Preferred Compositions

The present compositions preferably contain at least one compound containing from one to about six vinyl ether groups in an amount in the range of about 0 to about 80, more preferably about 20 to about 70, weight percent based on the total weight of the composition.

The present compositions preferably contain a compound having a saturated backbone and at least one of maleate and/or fumarate end groups in an amount in the range of about 0 to about 80, more preferably about 20 to about 70, weight percent based on the total weight of the composition.

The present compositions preferably contain the novel compounds of Formula I of this invention in an amount in the range of about 0 to about 80, more preferably about 0 to about 30, weight percent based on the total weight of the composition.

The viscosity of the present compositions at a temperature of 25° C. is preferably about 50 to about 25,000, more preferably about 50 to about 15,000, centipoise (cP) and is adjusted to enhance the use of the compositions.

The compositions of the present invention are preferably solvent free and can contain up to about 40 percent by weight of conventional additives such as pigments, fillers, stabilizers and wetting agents.

Curing of the Compositions

The compounds and compositions of the present invention can be cured upon exposure to energy such as ionizing radiation, actinic energy, i.e., ultraviolet and visible light, and heat, i.e., thermal cure.

Conventional ionizing radiation sources include electron beam devices. The amount of ionizing radiation required for cure of a 3 mil thick film is about 1 to about 30 megarads.

When cure of the compounds or compositions of the present invention is by exposure to actinic energy of appropriate wavelength, such as ultraviolet light, a photoinitiator can be admixed with the monomer or composition. It is desirable to select the photoinitiator from the group consisting of (1) hydroxy- or alkoxy-functional acetophenone derivatives, preferably hydroxyalkyl phenones, or (2) benzoyl diaryl phosphine oxides. Formulations containing the two different types of ethylenic unsaturation, i.e., the vinyl ether group and the maleate/fumarate group, copolymerize rapidly in the presence of the specified groups of photoinitiators to provide a rapid photocure and also interact rapidly upon exposure to other types of energy such as electron beams or gamma radiation when no polymerization initiator is present.

Maleate/fumarate compounds by themselves respond poorly to photocure using, for example, ultraviolet light when the photoinitiator is an ordinary aryl ketone photoinitiator, such as benzophenone. Also, vinyl ethers alone do not exhibit any substantial curing response to ultraviolet light when these aryl ketone photoinitiators are utilized. Nonetheless, maleate/fumarate terminated compounds and vinyl ether compounds in admixture respond to the photocure very rapidly when the photoinitiator is correctly selected. The photocure, and the cure upon exposure to other types of energy such as electron beams or gamma radiation when no initiator is present, is especially rapid and effective when both of the described types of unsaturation are provided in polyfunctional compounds, particularly those of resinous character. The fastest cures are obtained when the respective functionalities are present in about the same equivalent amount.

Preferably the photoinitiators are (1) hydroxy- or alkoxy-functional acetophenone derivatives, more preferably hydroxyalkyl phenones, and (2) benzoyl diaryl phosphine oxides.

The acetophenone derivatives that may be used have the Formula VI:

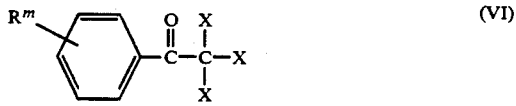
(VI)

in which $R^m$ is an optional hydrocarbon substituent containing from 1 to 10 carbon atoms and which may be alkyl or aryl, e.g., methyl, ethyl, butyl, octyl or phenyl, X is selected from the group consisting of hydroxy, $C_1$ to $C_4$ alkoxy, $C_1$ to $C_8$ alkyl, cycloalkyl, halogen, and phenyl, or 2 Xs together are cycloalkyl, and at least one X is selected from the group consisting of hydroxy and $C_1$ to $C_4$ alkoxy.

Many compounds have the required structure. The alkoxy groups are preferably methoxy or ethoxy, the alkyl group is preferably methyl or ethyl, the cycloalkyl group is preferably cyclohexyl, and the halogen is preferably chlorine. One commercially available compound is the Ciba-Geigy product Irgacure 651 which has the Formula VII:

(VII)

Irgacure 184, also from Ciba-Geigy, is another useful acetophenone derivative, and it has the Formula

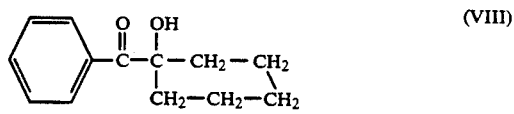
(VIII)

Still another commercially available useful acetophenone derivative is diethoxy acetophenone, available from Upjohn Chemicals, North Haven, Conn., which has the Formula IX:

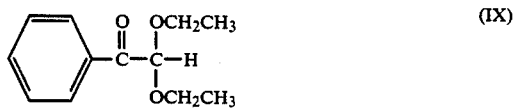
(IX)

When the photoinitiator is a hydroxy-functional compound, one can define the useful acetophenone derivatives in a somewhat different manner. Thus, the hydroxyalkyl phenones which are preferred herein have the Formula X:

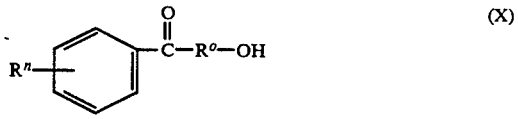
(X)

in which $R^o$ is an alkylene group containing from 2–8 carbon atoms and $R^n$ is an optional hydrocarbon substituent containing from 1 to 10 carbon atoms and which may be alkyl or aryl, e.g., methyl, ethyl, butyl, octyl or phenyl.

It is particularly preferred that the hydroxy group be in the 2-position in which case it is preferably a tertiary hydroxy group which defines a hydroxy group carried by a carbon atom that has its remaining three valences connected to other carbon atoms. Particularly preferred compounds have the Formula XI:

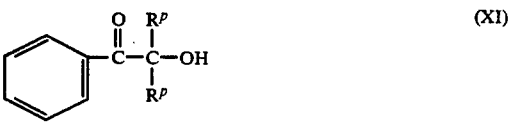
(XI)

in which each $R^p$ is independently an alkyl group containing from 1 to 4 carbon atoms. In the commercial produce Darocur 1173 (available from E-M Company, Hawthorne, N.Y.), each $R^p$ is methyl. This provides a compound which can be described as 2-hydroxy-2-methyl-1-phenyl propane 1-one. The "propane" is replaced by butane or hexane to describe the corresponding compounds, and these will further illustrate preferred compounds in this invention.

The benzoyl diaryl phosphine oxide photoinitiators which may be used herein have the Formula XII:

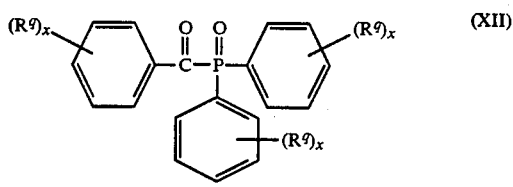

In Formula IX, $R^q$ is an optional hydrocarbon substituent containing from 1 to 10 carbon atoms and may be alkyl or aryl as previously noted, and each x is independently an integer from 1 to 3. In preferred practice, a 2,4,6-trimethyl benzoyl compound is used, and the two aromatic groups connected to the phosphorus atom are phenyl groups. This provides the compound 2,4,6-trimethyl benzoyl diphenyl phosphine oxide which is available from BASF under the trade designation Lucirin TPO.

When utilized, the photoinitiator is preferably present in an amount in the range of about 0.01 to about 10.0, more preferably about 0.1 to about 6.0, weight percent based on the total weight of the composition.

Suitable sources of actinic energy include lasers and other conventional light sources having an effective energy output, e.g., mercury lamps.

The wavelength of the actinic energy extends from the ultraviolet range, through the visible light range and into the infrared range. Preferred wavelengths are about 200 to about 2,000, more preferably about 250 to about 1,000, nanometers (nm).

The amount of actinic energy utilized to solidify a 3 mil thick film is about 0.05 to about 5.0, preferably about 0.1 to about 1, Joules per square centimeter (J/sqcm).

The monomers and compositions also can be thermally cured in the presence of a conventional thermal free-radical initiator, e.g., benzoyl peroxide, cyclohexanone peroxide N,N¹-azobis(isobutyrylnitrite), metallic dryer systems, redox systems, and the like.

The free-radical curable monomers and compositions of the present invention can be utilized, as coatings (especially as primary and secondary optical glass fiber coatings), in a metallization process wherein a non-metallic substrate is provided with a metal finish, to produce objects utilizing an optical fabrication process as described in U.S. Pat. No. 4,575,330 to Hull, in composite materials and other applications.

The following Examples are presented by way representation, and not limitation, of the present invention.

EXAMPLE 1 Preparation of a Compound of Formula I

Into a one liter 4-neck flask were introduced 298.3 grams (g) (1.732 equivalents) of diethylmaleate, commercially available from Aldrich Chemical Co., Milwaukee, Wis., 201.2 g (1.732 equivalents) of 4-hydroxybutyl vinyl ether (HBVE), commercially available from ISP Corp. under the trade designation Rapi-Cure HBVE, 0.5 g of tetraoctyl titanate, a conventional esterification catalyst commercially available from DuPont under the trade designation TYZOR TOT, and 0.22 g of phenothiazine, a conventional inhibitor commercially available from ICI Chemicals, Wilmington, Del. The flask was fitted with a variable speed stirrer, thermometers, a snyder column, a condenser with a trap, a nitrogen sparge and a heating mantle.

The temperature of the contents of the flask and the temperature at the top of the column were both monitored. A thermometer placed in the condenser at the top of the column was used to measure the temperature of distillate. The flask temperature was set to distill about 80 g of ethanol (b.p. 78° C.) in a time period of about 2.5 hours. The resultant product was a liquid having a viscosity at 25° C. of about 36 centipoise (cP).

EXAMPLE 2 Preparation of a Vinyl Ether Containing Oligomer

A 1 liter 4-neck flask was fitted with a variable speed stirrer, a heating mantle or ice water bath as needed, a dry air sparge and an addition funnel. The flask was charged with 95.25 g of 2,2,4-trimethyl hexane diisocyanate having a nitrogen-carbon-oxygen group content (NCO) of 39.68%, 41.5 g diethyl maleate as a diluent which also serves as a solvent in the preparation of this vinyl ether containing oligomer, 0.1 g of phenothiazine and 0.25 g dibutyl tin dilaurate. The contents of the flask were then heated to a temperature of 40° C. The funnel was then charged with 29.9 g of HBVE. The HBVE was slowly introduced into the flask over a time period of about one hour and the contents of the flask were maintained at that temperature for about one hour. Thereafter, 316.5 g of Tone 0221 were slowly added to the flask and the temperature of the contents of the flask maintained at about 70° C. for a time period of about 6 hours. Substantially all of the isocyanate functionality (NCO) was consumed. The percent NCO of the oligomer produced was about 0.02%. This oligomer had a theoretical molecular weight of about 3450 and a viscosity at 25° C. of 54,000 cP.

EXAMPLE 3 Preparation of a Vinyl Ether Containing Oligomer

A 2 liter 4-neck flask was fitted in a manner similar to the 1 liter flask of EXAMPLE 2. The flask was charged with 334.76 g (2.9809 equivalents) of IPDI (isophorone diisocyanate) and 0.5 g of dibutyltin dilaurate. The addition funnel was charged with 115.74 g (0.9964 equivalents) of HBVE. The stirrer was set at about 200 rpm, the sparge was activated and the ice water bath was utilized to maintain the contents of the flask at a temperature in the range of about 25° C. to about 30° C. The HBVE was slowly introduced into the flask over a time period of about 50 minutes. The contents of the flask were maintained in this temperature range for a time period of about 5 hours and then the temperature was raised to about 40° C. The addition funnel was then charged with 574.9 g (1.9924 equivalents) of Tone Polyol 2201. The Tone was introduced into the flask over a time period of about 20 minutes. The contents of the flask were maintained at a temperature of about 70° C. for a time period sufficient to consume substantially all of the remaining isocyanate functionality. The resulting oligomeric product had a viscosity of about 3,700,000 cP at a temperature of 25° C. and a theoretical molecular weight of about 2,000 daltons.

EXAMPLE 4 Preparation of a Vinyl Ether Containing Oligomer

A 1 liter 4-neck flask was fitted with a variable speed stirrer, a heating mantle, an addition funnel, and a dry air sparge. The flask was charged with 230 g of PCA-408, an aliphatic based elastomeric isocyanate prepolymer having an NCO of 4.07% that is commercially available from Polyurethane Specialties Co., Inc., Lyndhurst, N.J. The stirrer and sparge were activated. The addition funnel was charged with 26.51 g of HBVE which was introduced into the flask over a time period of about a half hour while maintaining the temperature of the contents of the flask in a range of about 50° to about 55° C. The contents of the flask were then maintained at a temperature of about 55° C. for a time period of 1 hour. An additional 8.12 g of HBVE was introduced into the flask and the temperature was maintained at 55° C. for 1 hour. Next, 0.09 g of dibutyl tin dilaurate were added and the contents of the flask maintained at a temperature of about 55° C. for a time period of about 4.5 hours. The resulting product had a viscosity of 25,000 cP at 25° C. and a theoretical molecular weight of about 2,300 daltons.

EXAMPLE 5 Preparation of a Maleate Terminated Saturated Reactant

A 2 liter 4-neck flask was fitted with a variable speed stirrer, thermometers, a snyder column, a condenser with a trap, a nitrogen sparge and a heating mantle. The flask was charged with 239.2 g (0.7560 moles) of Dianol 22, commercially available from Akzo Research, which is Bisphenol-A diethoxylate, 1041.6 (1.2096 moles) of diethyl maleate and 0.5 g of the esterification catalyst TYZOR TOT. The nitrogen sparge and the stirrer were turned on, the heating mantle was set to heat the contents of the flask until the vapor at the column top of condenser reached 78° C. The temperature of the contents increased to about 240° C. over a time period of about 4 hours. Over this time period 58.7 g of ethanol was collected which gives an actual conversion of about 95%.

EXAMPLE 6 Preparation of a Vinyl Ether Containing Oligomer

A 2 liter 4-neck flask was fitted with a variable speed stirrer, a heating mantle or ice water bath as needed, a dry air sparge and an addition funnel. The flask was charged with 413.21 g (3.6795 equivalents) of IPDI and 0.51 g of dibutyl tin dilaurate. The addition funnel was charged with 221.79 g (1.9093 equivalents) of Rapi-Cure HBVE which is 4-hydroxybutyl vinyl ether and is commercially available from ISP corp. The stirrer was set at about 200 rpm, the sparge was activated and the ice bath was utilized to maintain the contents of the flask at a temperature in the range of about 25 to about 35° C. The HBVE was slowly introduced into the flask over a time period of about 30 minutes. The contents of the flask were maintained in this temperature range for a time period of about 3 hours and then the temperature was raised to about 60° C. The addition funnel was then charged with an admixture of 116.5 g of DVE-3 which is triethyleneglycol divinyl ether and is commercially available from GAF, 138.1 g (1.3539 equivalents) of Tone Polyol 0301 and 110.7 g (0.4025 equivalents) of Tone Polyol 2201. The admixture was introduced into the flask over a time period of about 10 minutes after which the contents of the flask exothermed to raise the temperature to about 105° C. The temperature of the contents of the flask was then cooled to about 70° C. and maintained at that temperature for a time period of about 1.5 hours. The resulting product had a viscosity of about 692,000 cP at a temperature of 25° C. and a percent nitrogen-carbon-oxygen group content (NCO) of about 0.02 percent.

EXAMPLE 7 Preparation of a Vinyl Ether Containing Oligomer

A 2 liter 4-neck flask was fitted in a manner similar to the flask of EXAMPLE 6. The flask was charged with 278.72 g (2.4819 equivalents) of IPDI and 0.4 g of dibutyl tin dilaurate. The addition funnel was charged with 143.7 g (1.2371 equivalents) of HBVE. The stirrer was set at about 160 rpm, the sparge was activated and the ice water bath was utilized to maintain the contents of the flask at a temperature in the range of about 25° to about 30° C. The HBVE was slowly introduced into the flask over a time period of about 50 minutes. The contents in the flask were maintained in this temperature range for a time period of about 2½ hours and then the temperature was raised to about 60° C. Then, 200.1 g of DVE-3 were introduced into the flask. The addition funnel was then charged with 372.1 g (1.2403 equivalents) of Tone Polyol 310. The Tone Polyol was introduced into the flask over a time period of about a half hour. During the addition of the Tone Polyol the temperature of the contents of the flask was maintained at a temperature in the range of about 60° to about 85° C. The resulting product had a viscosity of about 20,000 cP at a temperature of 25° C. and a NCO of less than 0.02 percent.

EXAMPLE 8 Preparation of a Vinyl Ether Containing Oligomer

A 1 liter 4-neck flask was fitted in a manner similar to the flask of EXAMPLE 4. The flask was charged with 210.85 g (1.8718 equivalents) of IPDI and 0.27 g of dibutyl tin dilaurate. The addition funnel was charged with 113.22 g (0.9747 equivalents) of HBVE. The stirrer was set at about 200 rpm, the sparge was activated and the ice water bath utilized to maintain the temperature of the contents in the flask at a temperature in the range of about 20° to about 30° C. The HBVE was introduced into the flask over a time period of about 1.5 hours and then the temperature was raised to about 50° C. The addition funnel was then charged with an admixture of 49.9 g of DVE-3, 70.0 g (0.6803 equivalents) of Tone Polyol 0301 and 53.7 g (0.2039 equivalents) of Tone Polyol 0200. The admixture was introduced into the flask over a time period of about 20 minutes. The temperature of the contents of the flask was then maintained at a temperature of about 70° C. for a time period of about 2.5 hours. The resulting product had a viscosity of 1,100,000 cP at a temperature of 25° C.

EXAMPLE 9 Preparation of a Vinyl Ether Containing Oligomer

A 1 liter 4-neck flask was fitted in a manner similar to the flask of EXAMPLE 4. The flask was charged with 140.5 g (1.256 equivalents) of IPDI and 0.2 g of dibutyl tin dilaurate. The addition funnel was charged with 105.2 g (0.618 equivalents) of RAPI-CURE CHMVE (4-[(ethenoxy)methyl]cyclohexanemethanol). The stirrer was set at about 160 rpm, the sparge was activated and the ice water bath was utilized to maintain the contents of the flask at a temperature in the range of about 25° to about 30° C. The 4-[ethenoxy)methyl]cyclohexanemethanol was slowly introduced into the flask over a time period of about 50 minutes. The contents in the flask were maintained in this temperature range for a time period of about 2½ hours and then the temperature was raised to about 60° C. Then, 100.1 g of DVE-3 were introduced into the flask. The addition funnel was then charged with 186.1 g (0.604 equivalents) of Tone Polyol 310. The Tone Polyol was introduced into the flask over a time period of about a half hour. During the addition of the Tone Polyol the temperature of the contents of the flask was maintained at a temperature in the range of about 60° to about 85° C. The resulting product had a viscosity of about 96,400 cP at a temperature of 25° C. and a NCO content of less than 0.02 percent.

EXAMPLE 10 Preparation of a Vinyl Ether Containing Oligomer

A 1 liter 4-neck flask was fitted in a manner similar to the flask of EXAMPLE 6. The flask was charged with 166.7 g (1.49 equivalents) of IPDI and 0.2 g of dibutyltin dilaurate. The addition funnel was charged with 84.8 g (0.4982 equivalents) of 4-[(ethenoxy)methyl]cyclohexanemethanol RAPI-CURE CHMVE. The stirrer was set at about 200 rpm, the sparge was activated and the ice water bath was utilized to maintain the contents of the flask at a temperature in the range of about 25° C. to about 30° C. The 4-[(ethenoxy)methyl] cyclohexanemethanol was slowly introduced into the flask over a time period of about 50 minutes. The contents of the flask were maintained in this temperature range for a time period of about 5 hours and then the temperature was raised to about 40° C. The addition funnel was then charged with 271.0 g (0.9962 equivalents) of Tone Polyol 2201. The Tone was introduced into the flask over a time period of about 20 minutes. The contents of the flask were maintained at a temperature of about 70° C. for a time period sufficient to consume substantially all of the remaining isocyanate functionality. The resulting oligomeric product had a viscosity of about 8,000,000 cP at a temperature of 25° C. and a theoretical molecular weight of about 2,000 daltons.

EXAMPLE 11 Compositions

Compositions utilizing the products of EXAMPLES 1 to 8 and other components were prepared. The formulations of the compositions are provided in TABLE I, below. Compositions A to D are particularly well suited for use as primary coatings for optical glass fiber and compositions E to H are well suited for use as secondary coatings for optical glass fiber.

TABLE I

| | COMPOSITIONS | | | | | | | |
|---|---|---|---|---|---|---|---|---|
| | Composition | | | | | | | |
| Component | A (wt %)[1] | B (wt %) | C (wt %) | D (wt %) | E (wt %) | F (wt %) | G (wt %) | H (wt %) |
| Example 1[2] | 13.9 | — | — | — | — | — | — | — |
| Example 2[3] | 83.2 | — | — | — | — | — | — | — |
| Example 3[4] | — | 83.6 | 72.7 | — | — | — | — | — |
| Example 4[5] | — | — | — | 84.4 | — | — | — | — |
| Example 5[6] | — | — | — | — | 14.7 | 28.3 | 28.6 | 13.1 |
| Example 6[7] | — | — | — | — | 58.6 | — | — | — |
| Example 7[8] | — | — | — | — | — | 47.2 | 53.7 | — |
| Example 8[9] | — | — | — | — | — | — | — | 67.9 |
| Diethyl Maleate | — | 13.4 | 20.5 | 12.6 | 23.5 | 17.9 | 14.8 | 16.1 |
| Rapicure DVE-3[10] | — | — | 4.8 | — | — | 3.5 | — | — |
| Phenothiazine[11] | 0.1 | 0.1 | 0.1 | — | 0.3 | 0.2 | — | — |
| Lucirin TPO[12] | 2.9 | 2.9 | — | — | 2.9 | 2.9 | — | — |
| Irgacure 184[13] | — | — | 2.4 | — | — | — | 2.9 | 2.9 |
| Darocur 1173[14] | — | — | — | 2.9 | — | — | — | — |

[1]Weight percent.
[2]The compound of Example 1.
[3]The vinyl ether containing oligomer of Example 2.
[4]The vinyl ether containing oligomer of Example 3.
[5]The vinyl ether containing oligomer of Example 4.
[6]The saturated reactant of Example 5.
[7]The vinyl ether containing oligomer of Example 6.
[8]The vinyl ether containing oligomer of Example 7.
[9]The vinyl ether containing oligomer of Example 8.
[10]Triethyleneglycol divinyl ether is commercially available from ISP Corp.
[11]An inhibitor.
[12]The photoinitiator 2,4,6,trimethylbenzoyldiphenylphosphine oxide is commercially available from BASF.
[13]The photoinitiator hydroxycyclohexyl phenyl ketone is commercially available from Ciba-Geigy Corp., Ardsley, NY.
[14]The photoinitiator 2-hydroxy-2-methyl-1-phenylpropane-1-one is commercially available from E-M Company, Hore, NY.

The results of tests conducted on compositions A to D, and coatings produced therefrom are presented in TABLE II. Test results are also provided for two commercially available acrylate compositions W and X. The test procedures follow Table II.

TABLE II

| | TEST RESULTS | | | | | |
|---|---|---|---|---|---|---|
| | Compositions | | | | | |
| | | | | | Conventional[1] | |
| Property | A | B | C | D | W | X |
| Viscosity, Pa s | NA[2] | NA | 6.2 | NA | 4.2 | 12.5 |
| Cure Dose, J/sqcm | <1.0 | <1.0 | <1.0 | <1.0 | 1.2 | 1.0 |
| Tensile Properties | | | | | | |
| Tensile, MPa | 2.7 | 4.6 | 0.7 | 0.6 | 0.4 | 1.4 |
| Elongation, | 69 | 150 | 48 | 72 | 110 | 80 |
| Modulus, MPa | 3.0 | 3.0 | 1.4 | 1.2 | 1.3 | 2.0 |
| Water Resistance | | | | | | |
| % Water Absorp. | 0.4 | 0.7 | 3.2 | NA | 0.5 | 2.0 |
| % Extractable | −2.2 | 0.0 | −5.8 | NA | −0.5 | −2.0 |
| $H_2$ Generation, $\mu l/g$ | 0.5 | 0.1 | NA | 0.4 | 1.1 | 0.4 |
| Glass Transition Temp (°C.) | −27 | NA | NA | −30, +14[3] | −35 | −12 |

[1]Compositions W and X are commercially available from Dainippon Ink Co. and ICI, respectively, and are acrylate containing primary optical glass fiber coating compositions.
[2]Not available
[3]Bimodal DMA Trace.

Viscosity

The viscosity, expressed in pascal seconds (Pa s), was measured using a Brookfield Model RVTD viscometer operated in accordance with the instructions provided therewith. The temperature of each sample tested was 25° C.

Cure Dose

The cure dose is the dosage required to achieve 95% of the ultimate modulus. A cure dose of 1.0 J/sqcm or less is desirable.

Tensile Properties

A film for determination of the tensile properties, i.e., tensile strength Megapascals (MPa), percent elongation at break (%) and modulus (MPa), expressed in, of the coating was prepared by drawing down a 3 mil coating on glass plates using a Bird bar, commercially available from Pacific Scientific, Silver Springs, Md. An automatic draw down apparatus like a Gardner AG-3860 commercially available from Pacific Scientific, Gardner/Neotec Instrument Division, Silver Springs, Md., can be utilized. The coating was cured using a "D" lamp from Fusion Curing Systems, Rockville, MD. The "D" lamp emits radiation having a wavelength of about 200 to about 470 nanometers with the peak radiation being at about 380 nanometers and the power output thereof is about 300 watts per linear inch. The coating was cured at a dose of about 1 J/sqcm which provided complete cure. The film was then conditioned at 23±2° C. and 50±3% relative humidity for a minimum time period of 16 hours.

Six, 0.5 inch wide test specimens were cut from the film parallel to the direction of the draw down and removed from the glass plate. Triplicate measurements of the dimensions of each specimen were taken and the average utilized. The tensile properties of these specimens were then determined using an Instron Model 4201 from Instron Corp., Canton, Mass. operated in accordance with the instructions provided therewith.

Water Resistance

To determine the water resistance a 10 mil drawdown of the composition was made on a glass plate utilizing a Bird bar. The composition was cured utilizing the "D" lamp at a dose of 1.0 J/sqcm. Three test samples each having dimensions of $\frac{1}{2}'' \times 1'' \times \frac{1}{2}''$ were cut from the cured coating. Each sample was weighed utilizing an analytical balance to obtain weight measurement A and then immersed in separate containers of deionized water. After a time period of 24 hours, the samples were removed from the water, blotted to remove excess water on the surface and reweighed to obtain weight measurement B. The samples were then placed in aluminum pans and maintained therein at ambient conditions, i.e., ambient temperature (about 20°-30° C.) and ambient humidity, for a time period of 120 hours. The samples were then reweighed to obtain weight measurement C. The following equations were utilized to calculate the water absorption and the extractables.

$$\% \text{ water absorption} = [(B-A)/A] \times 100 \quad \text{(I)}$$

$$\% \text{ extractables} = [(C-A)/A] \times 100 \quad \text{(II)}$$

It is preferably to have relatively low % water absorption and % extractables.

Hydrogen (H2) Generation

Cured films for determination of the hydrogen generation of the composition were prepared by drawing down a 10 mil coating on glass plates using a Bird bar, commercially available from Pacific Scientific, Silver Springs, MD. The film was cured using the "D" lamp. The coating was cured at a dose of about 1 J/sqcm which provided complete cure.

Eight grams, measured to the nearest 0.01 gm, of the cured film were placed in a dry 100 ml bottle. The bottle was then purged with an inert gas and immediately sealed with a septum and seal. The sealed bottle was then placed in an air circulating oven having a temperature of 80°±2° C. and maintained therein for a time period of 24 hours. After 24 hours, the bottle was removed from the oven and cooled to room temperature. An air sample was removed from the bottle utilizing a syringe. Twenty ml of the air sample were introduced into a calibrated Key-Med Exhaled Hydrogen Monitor and the hydrogen concentration read in parts per million (ppm) from the readout of the monitor. The microliters/gram ($\mu$l/g) of hydrogen generated was determined utilizing the following equation:

$$\mu l/g = \frac{[H_2] (0.120)}{g \text{ cured coating}}$$

wherein: $H_2$ is the hydrogen concentration in ppm; 0.120 is the conversion factor to convert ppm hydrogen in the bottle into $\mu$l of hydrogen evolved from the sample; and gm cured coating is the gm of the cured film placed in the bottle.

A relatively low hydrogen generation is desirable as hydrogen can interfere with the performance of the fiber by increasing transmission loss.

Glass Transition Temperature

The glass transition temperature was determined by dynamic mechanical analysis.

As the test results indicate, optical glass fiber coatings prepared from the compositions of the present invention have properties that are comparable to the properties of optical glass fiber coatings produced from commercially available compositions. Furthermore, the compositions of the present invention do not utilize acrylate or methacrylate diluents and therefore have a lower toxicity than compositions containing these acrylate or methacrylate diluents.

The results of tests conducted on compositions E to H, and coatings produced therefrom are presented in TABLE III. Test results are also provided for two commercially available acrylate compositions Y and Z. The test procedures are provided after TABLE III.

TABLE III

| Conventional[1] Property | TEST RESULTS Compositions | | | | | |
|---|---|---|---|---|---|---|
| | E | F | G | H | Y | Z |
| Viscosity, Pa s | 2.7 | 1.3 | 2.6 | 9.0 | 4.3 | 11.5 |
| Cure Dose, J/sqcm | 0.6 | 0.7 | <1.0 | <1.0 | 0.35 | 0.3 |
| Tensile Properties | | | | | | |
| Tensile, MPa | 21 | 29 | 18 | 26 | 40 | 42 |
| Elongation, % | 15 | 14 | 27 | 19 | 24 | 11 |
| Modulus, MPa | 590 | 600 | 295 | 540 | 980 | 1125 |
| Water Resistance | | | | | | |
| % Water Absorp. | 0.5 | 0.6 | 0.8 | 0.5 | 2.0 | 6.5 |

TABLE III-continued

| Conventional[1] Property | TEST RESULTS Compositions | | | | | |
|---|---|---|---|---|---|---|
| | E | F | G | H | Y | Z |
| % Extractables | −0.8 | −0.7 | −0.4 | −1.3 | 0.0 | −1.5 |
| $H_2$ Generation, μl/g | 0.4 | 0.2 | NA | NA | 0.2 | 0.5 |
| Coefficient of Friction, ss | 0.86 | 0.77 | NA | NA | NA | 0.5 |

[1]Compositions Y and Z are commercially available from Dainippon Ink Co. and ICI, respectively, and are acrylate containing secondary optical glass fiber coating compositions.

Viscosity, Cure Dose, Tensile Properties, Water Resistance and Hydrogen ($H_2$) Generation were determined as above in Table II.

Coefficient of Friction, ss

To determine the coefficient of friction (COF) for film to stainless steel (ss) contact, films were prepared by drawing down 3 mil coatings on glass plates using a Bird bar. An automatic draw down apparatus like a Gardner AG-3860 commercially available from Pacific Scientific, Gardner/Neotec Instrument Division, Silver Springs, Md. can be utilized. The coatings were cured using the "D" lamp.

The test was performed utilizing an apparatus including a universal testing instrument, e.g., an Instron Model 4201 commercially available from Instron Corp., Canton, Mass., a device, including a horizontal support and a pulley, positioned in the testing instrument and a COF sled having a weight of about 100 g and three polished stainless steel spherical balls that were affixed is a triangular relationship on one of the planar surfaces having the largest surface area with none of the balls tracing overlapping paths on the cured film.

The coated glass plate was secured to the horizontal support with the coated face of the plate facing up.

To determine the COF, ss, the COF sled was weighed to the nearest 0.1 g. The COF sled was placed on the film of the coated glass plate with the balls contacting the film. A wire from the COF sled was run parallel to the glass plate and then run through the pulley in a direction perpendicular to the glass plate.

The free end of the wire was then clamped in the upper jaw of the testing instrument which was then activated. The COF sled traveled 4 inches on the film of the coated glass plate.

The COF was calculated by dividing the average load (obtained from the recorder of the instrument), in grams, by the weight of the COF sled.

As the test results indicate, optical glass fiber coatings prepared from the compositions of the present invention have properties that are comparable to the properties of optical glass fiber coatings produced from commercially available compositions. Furthermore, the compositions of the present invention do not utilize acrylates or methacrylates and therefore have a lower toxicity than compositions containing acrylates or methacrylates.

EXAMPLE 12 Compositions Comprising Various Saturated Ester Oligomers Having Maleate End Groups Several saturated ester oligomers having maleate end groups were prepared by reacting the saturated dicarboxylic acid with the product of the reaction of trishydroxyethyl isocyanurate with the butyl carbitol ester of maleic acid.

The saturated ester oligomers having maleate end groups had the general Formula XIII:

$$(BCMA)_2—THEIC—DCA—THEIC—(MABC)_2 \qquad (XIII)$$

wherein BC is the butyl Carbitol ® residue, Mass. is the maleate, THEIC is the tris(hydroxyethyl) isocyanurate residue and DCA is the appropriate dicarboxylic acid residue.

The components, and proportions thereof, utilized to produce the saturated ester oligomers having maleate end groups are presented in Table IV.

TABLE IV

| Saturated Ester Oligomers Having Maleate End Groups | | | | |
|---|---|---|---|---|
| | Components (Parts by Weight) | | | |
| Composition (DCA) | DCA | MA[1] | BC[2] | THEIC[3] |
| I (None) | 0 | 27.2 | 48.6 | 24.2 |
| J (Azelaic) | 10.6 | 22.0 | 38.1 | 29.3 |
| K (Phthalic) | 8.5 | 22.5 | 39.1 | 29.9 |
| L (Dimer Acid[4]) | 26.2 | 18.1 | 31.5 | 24.2 |

[1]MA = maleic anhydride.
[2]BC = butyl Carbitol ®
[3]THEIC = tris(hydroxyethyl) isocyanurate.
[4]Dimer Acid = Empol 1010 Dimer Acid commerically available from Emery Chemical.

The saturated ester oligomers having maleate end groups were admixed with triethylene glycol divinyl ether at a vinyl ether group to maleate group ratio of 1:1. The photoinitiator Darocur 1173 was present in an amount of 4 weight percent. The compositions were applied to the substrate and cured. The results are presented in TABLE V.

TABLE V

| | Test Results | | | | | | |
|---|---|---|---|---|---|---|---|
| | Maleate Equivalent Wt | Theoretical Functionality | Viscosity (cP) | Exposure (J/sqcm) | | | |
| Composition | | | | 0.3 | 0.5 | 1.0 | 2.0 |
| | | | | MEK Double Rubs | | | |
| I[1] | 337 | 3 | 7,400 | >200 | ND[2] | ND | ND |
| J | 417 | 4 | 33,040 | ND | ND | >200 | ND |
| K | 412 | 4 | 136,400 | 135 | 145 | >200 | ND |
| L | 513 | 4 | 66,400 | ND | ND | 82 | 85 |

[1]See component 2 of Example 16.
[2]ND = not determined

The viscosity of the saturated ester oligomers having maleate end groups was determined utilizing a Brookfield RTV viscometer.

The MEK Double Rubs test consists of rubbing the surface with a cloth soaked in methyl ethyl ketone (MEK). A section of the surface was rubbed in one direction and then in the opposite direction over the same section to constitute one double rub. The number provided is the number of double rubs at which deterioration of the film was first noted.

The tests results show that saturated dicarboxylic acids can be utilized. The coating produced from the Dimer Acid containing composition is suitable for many applications.

EXAMPLE 13: Coating Compositions for Vulcanized Rubber

Compositions of the present invention suitable as coatings for vulcanized rubber were prepared and tested. The compositions utilized the vinyl ether containing oligomer of EXAMPLE 3. Composition N also utilized the compound of EXAMPLE 1. The formulations of the compositions are presented in TABLE VI.

TABLE VI

| Coating Compositions For Vulcanized Rubber | | |
|---|---|---|
| | Composition (wt %): | |
| Component | M | N |
| Vinyl Ether Containing Oligomer[1] | 82.9 | 79.4 |
| Diethyl Maleate | 14.1 | 13.5 |
| Monomer[2] | — | 4.0 |
| Lucirin TPO | 2.9 | — |
| Irgacure 184 | — | 2.9 |
| Phenothiazine | 0.1 | 0.2 |

[1]The vinyl ether containing oligomer of EXAMPLE 3.
[2]The compound of EXAMPLE 1.

The test results are provided in Table VII.

TABLE VII

| Test Results | | |
|---|---|---|
| | Composition: | |
| Property | M | N |
| Cure dose (J/sqcm) | 1 | 1 |
| Surface condition | Tacky | Slight tack |
| Viscosity (cP) | High | 20,000 |
| Adhesion: 610 | Good | Good |
| Elongation (%) | 153 | 80 |

All coatings were prepared by drawing down a film on a styrene-butadiene rubber substrate and the film was cured.

The test procedures for cure dose, viscosity and elongation have been discussed above.

Adhesion: 610

The adhesive surface of Scotch brand 610 tape, commercially available from 3M Company, was adhered to the film. The tape was then pulled from the film and a qualitative analysis of how well the film adhered to the substrate was made.

EXAMPLE 14: Paper Coating Compositions

Compositions of the present invention suitable for paper coatings were prepared and tested. The saturated ester oligomer having maleate end groups was prepared by reacting azeleic acid with the product of the reaction of trishydroxyethyl isocyanunate with the butyl carbitol ester of maleic acid (Example 12J).

The compositions prepared and tested had the following formulations as provided in Table VIII.

TABLE VIII

| Paper Coating Compositions | | | | |
|---|---|---|---|---|
| | Composition (wt %): | | | |
| Component | O | P | Q | R |
| Saturated Ester Oligomer[1] | 73.5 | 73.5 | 73.5 | 63.9 |
| DVE-3 | 26.5 | 26.5 | 26.5 | 23.0 |
| Diethyl Maleate | — | — | — | 13.1 |
| DC 57[2] | 1.0 | 1.0 | — | 0.5 |
| MPPVF 620[3] | 0.5 | 0.5 | 0.5 | — |
| Phenothiazine | 0.1 | 0.1 | 0.1 | 0.1 |
| Benzophenone | 2.0 | — | — | — |
| Darocure 1173 | — | 7.0 | 4.0 | 7.0 |
| Diethyl Amine | — | 4.0 | — | — |
| UVI 6990[4] | — | — | 0.5 | — |

[1]Saturated Ester Oligomer produced in Example 12J.
[2]A surfactant available from Dow Corning.
[3]A wax available from Micro Powders Inc., Yonkers, NY.
[4]A cationic photoinitiator available from Union Carbide, Corp.

The above compositions were drawn down on a paper substrate, or a glass plate for determination of the adhesion and Tensile Properties, cured and subjected to various tests are provided in TABLE IX.

TABLE IX

| Test Results | | | | |
|---|---|---|---|---|
| | Composition: | | | |
| Property | O | P | Q | R |
| Cure dose (J/sqcm) | 1 | 0.4 | 0.5 | 0.5 |
| MEK Double Rubs | 10 | 14 | 30 | ND[1] |
| Gloss (75°) | 95 | 97 | 97 | 93 |
| Suth. Rubs (500 Rubs, 4#) | Excellent | ND | ND | ND |
| Adhesion: | | | | |
| 610 (%) | 100 | 100 | 100 | 100 |
| Scotch (%) | 500 | ND | 20 | 100 |
| Tensile Properties | | | | |
| Tensile (MPa) | 2.8 | ND | ND | ND |
| Elongation (%) | 11.0 | ND | ND | ND |
| Modulus (MPa) | 4.0 | ND | ND | ND |

[1]Not determined

The test procedures for determining cure dose, MEK Double Rubs and Tensile Properties have been discussed previously.

Gloss (75°)

The gloss was determined on a Gardner Gloss Meter.

Sutherland Rubs

This test was conducted on a Sutherland ink rub tester that is available from James River Corp., Kalamazoo, Mich. that was operated in accordance with the instructions supplied therewith.

Adhesion

The two tests were conducted by a procedure similar to the Adhesion 610 test. However, 10 parallel cuts, equally spaced apart, were made in the film down to the substrate. Then, 10 parallel cuts, also equally spaced apart, were made perpendicular to the first 10 cuts. The cut section was then covered with tape that adhered to the surface. The tape was removed and the number of squares of film remaining adhered to the substrate is the percent adhesion. Two types of tape used were the 610 tape and scotch tape.

EXAMPLE 15: Coating Compositions for Metallization Non-Metallic Substrates

Composition F of EXAMPLE 11 is well adapted as a coating composition for the metallization of non-metallic substrates. A substrate, e.g., a polycarbonate, is coated with a primer composition which is cured. Next, a powdered metal, e.g., aluminum, is conventionally applied over the cured primer composition. The metal coating is then overcoated with a composition which is cured. Conventionally, the primer and the overcoat compositions can be two different compositions. However, the composition of the present invention, e.g. Composition F, can function as both the primer and the overcoat composition. Very good adhesion between the substrate, the first coat, the metal layer and the overcoat is obtained. Thus, only one coating composition is required.

Further representative of the compositions of the present invention suitable in a metallization process is a composition including 76.4 g of the saturated reactant of EXAMPLE 8, 23.6 of DVE-3, 4.0 g of the photoinitiator Darocur 1173 and 0.1 g of phenothiazine. This composition had a viscosity of 470 cP at 25° C. A cure dose of 0.5 J/sqcm resulted in a cured film that withstood 200 MEK double rubs and had a pencil hardness of 2H. There was 100% adhesion of the film to a polycarbonate substrate when adhesion was tested by a conventional crosshatch method using 610 scotch brand tape commercially available from 3M Company.

EXAMPLE 16: Free-Radical Curable Compositions

Component 1, a vinyl ether containing oligomer, was prepared by first reacting 13.4 parts by weight of a trimethylolpropane/caprolactone triol, commercially available from Union Carbide, New York, N.Y. under the trade designation Tone 0301, 11.0 parts by weight of a neopentyl glycol/caprolactone diol, commercially available from Union Carbide under the trade designation Tone 2201, 41.6 parts by weight of isophorone diisocyanate in 16.7 parts by weight of triethylene glycol divinyl ether, and 0.02 percent by weight of dibutyltin dilaurate in a suitable vessel. The vessel is equipped with a heating mantle (to permit temperature control), an agitator and a dry gas source that provides a gas blanket over the reactants. This first reaction was conducted at a temperature of about 30° C. for a time period of 2.5 hours. After completion of the first reaction, 22.3 parts by weight of hydroxybutyl vinyl ether was introduced into the vessel to react with the product of the first reaction of Component 1. This second reaction of Component 1 was conducted at a temperature of about 50°-60° C. until substantially all of the nitrogen-carbon-oxygen (NCO) groups of the diisocyanate were reacted. Infrared spectroscopy was utilized to determine when substantially all of the NCO groups were reacted. The vinyl ether containing oligomer had an equivalent weight of 460 grams (g) per vinyl ether containing oligomer double bond and a viscosity, at a temperature of 25° C., of 1.2 megapascals (MPa).

Component 2, a maleate terminated saturated ester oligomer, was prepared by first reacting 27.2 parts by weight of maleic anhydride with 48.6 parts by weight of butyl Carbitol ® at a temperature of 120° C. for a time period of 3 hours in a separate vessel similar to the vessel utilized in producing Component 1. Subsequently, 24.2 parts by weight of tris(hydroxyethyl) isocyanurate was introduced into the vessel and reacted with the product of the first reaction of Component 2. This second reaction of Component 2 was continued for a time period of 19 hours during which time period the temperature of the reactants was raised from 150° C. to 205° C. and water was removed with a xylene azeotrope. The resultant maleate terminated saturated ester oligomer had an acid number of 7.0, a viscosity at a temperature of 25° C. of 7400 cP and an equivalent weight of 337 gm per maleate double bond.

Component 3 (the compound of Example 1) was prepared by reacting 59.7 parts by weight of diethyl maleate with 40.3 parts by weight of hydroxybutyl vinyl ether utilizing 0.05 parts by weight of the catalyst TYZOR TOT which is a tetra octyl titanate catalyst commercially available from DuPont Co., Wilmington, Del. Ethanol, which is a by-product of this reaction, is removed by distillation. The resultant dual functional monomer, 4-vinyloxybutyl ethyl maleate, had a viscosity of 36 cP at a temperature of 25° C.

Aliquots of the components were admixed to produce compositions that were admixed with 4 parts by weight of the photoinitiator Darocur 1173 and drawn down on a clean aluminum Q panel as a 1 mil thick layer. Each layer was exposed to ultraviolet radiation from a UV unit made by 1st America Division of Syndicate Sales having a pulsed zenon lamp having a wavelength of about 250 to about 400 nm. Three levels of exposure were studied, i.e., 0.5, 1.0 and 2.0 J/sqcm. Each cured layer was then subjected to the MEK Double Rub test. The compositions studied, viscosities (measured at 25° C.), and results of the MEK Double Rub test are presented in Table X below. Many industries utilize compositions that produce coatings that withstand 100 MEK Double Rubs.

TABLE X

| | Compositions and Test Results | | | | | | |
|---|---|---|---|---|---|---|---|
| | Component (parts by weight) | | | | Exposure (J/sqcm) | | |
| | | | | Viscosity | 0.5 | 1.0 | 2.0 |
| Composition | 1 | 2 | 3 | (cP) | MEK Double Rubs | | |
| S | 57.7 | 42.3 | — | 21,250 | ND[1] | 95 | 195 |
| T | 51.9 | 38.1 | 10.0 | 8,950 | 150 | >200 | ND |

[1]ND = not determined

The test results indicate the effectiveness of utilizing compounds of Formula I to reduce viscosity and improve cure speed.

EXAMPLE 17: Compositions Containing Saturated Polyester Having Maleate End Groups A flask was fitted with a variable speed stirrer, thermometers, a snyder column, a condenser with a trap, a nitrogen sparge and a heating mantle. One equivalent hydroxyl from a polycarbonate polyol, or polycaprolactone polyol, and one mol of maleic anhydride were introduced into the flask. The contents of the flask were heated to a temperature of 60° C.- and held at that temperature for a time period sufficient to obtain a constant acid value (about 2 hours). The flask was then charged with 0.1% benzyltrimethylammonium chloride. The addition funnel was charged with two equivalents, i.e., twice the amount necessary for a 1:1 equivalents ratio, of propylene oxide which was introduced into the flask over a time period of 1 to 2 hours as necessary to maintain a slow reflux. When all of the propylene oxide had been added, the temperature of the contents was increased, as necessary, to maintain a slow reflux of propylene oxide. When the contents reached a temperature of 100° C., they were maintained at that temperature for a time period (about 4 to 10 hours) sufficient to obtain an acid value of less than 10. The excess propylene oxide was collected at 100° C. at a reduced pressure. The product was a saturated polyester having maleate end groups.

The polycarbonate or polycaprolactone backbone composition, and the viscosity and equivalent weight of the maleate terminated products are provided in TABLE XI.

TABLE XI
Saturated Polyesters Having Maleate End Groups

| Polyester[1] | Polycarbonate or polycaprolactone | Equivalent wt | Viscosity (cP) |
|---|---|---|---|
| 11A | Duracarb 120 | 572 | 3,900 |
| 11B | Duracarb 124 | 1077 | Solid |
| 11C | Tone 0301 | 258 | 40,600 |
| 11D | Tone 0310 | 456 | 8,144 |
| 11E | Tone 2221 | 666 | Solid |
| 11F | Tone 0200 | 419.5 | 2,784 |

[1]Saturated Polyester having maleate end groups prepared by the process of this Example.

Compositions were prepared utilizing the saturated polyesters having maleate end groups of this Example and the photoinitiator Durocure 1173 at 4.0 wt % and the stabilizer phenothiazine at 0.2 wt %. Each composition utilized DVE-3 to vary the vinyl ether to maleate/fumarate (VE/MA) ratio as indicated in TABLE XII. Some compositions also utilized a 1:1 equivalent ratio of vinyl ether to diethyl fumarate in the weight percent indicated to reduce the viscosity. The compositions were drawn down as films on an unprimed aluminum substrate. The test results are presented in TABLE XII.

removed. The compositions prepared and their properties are summarized below.

| | UPE A | UPE B | UPE C |
|---|---|---|---|
| Reactant | | | |
| Maleic Anhydride | 43.0% | 28.6% | 14.3% |
| Succinic Anhydride | — | 14.6% | 29.1% |
| 1,5-Pentane diol | 57.0% | 56.8% | 56.6% |
| Properties | | | |
| Viscosity (cP) | 3340 | 3050 | 2800 |
| Acid Value | 7.5 | 3.7 | 3.3 |
| Double Bond eq. Wt. | 210 | 316 | 634 |

UV curable coating compositions were prepared from these UPE's. These are shown below.

| | Coating A | Coating B | Coating C |
|---|---|---|---|
| Component | | | |
| UPE A | 67.5 | | |
| UPE B | | 75.8 | |
| UPE C | | | 86.3 |
| DVE-3 | 32.5 | 4.0 | 4.0 |
| Darocur 1173 | 4.0 | 4.0 | 4.0 |
| Coating Properties (1 mil film) MEK Double Rubs (1 J/cm$^2$) | >200 | >200 | 131 |
| Physical Properties (3 mil film) | | | |
| Cure dose (J/cm$^2$) | 1.0 | 0.5 | 0.5 |
| Tensile Strength (MPa) | a | 4.1 | 1.5 |
| Percent Elongation | a | 3.0 | 7.0 |
| Modulus (MPa) | a | 153 | 19 | a — too brittle to measure

TABLE XII

| Saturated Polyester[1] | VE/MA RATIO | Viscosity (cP) | MEK Double Rub (Cure) dose, J/sqcm | Pencil Hardness | Tensile Strength (MPa) | Elongation (%) | Modulus (MPa) |
|---|---|---|---|---|---|---|---|
| 11A | 0.5/1.0 | 1850 | 115(1), 80(0.3) | <4B | | | |
| | 1.0/1.0[2] | 1050 | >200(1), 225(0.3) | 2B | 5.6 | 24.2 | 25 |
| | 1.5/1.0[2] | 650 | >200(1), 125(0.3) | 4B | | | |
| 11B | 1.0/1.0 | SOLID | 88(1), 58(0.3) | <4B | 1.8 | 33 | 7 |
| | 1.0/1.0[3] | WAXY | 100(1), 71(3) | <4B | 2.8 | 33 | 10 |
| | 1.0/1.0[4] | 725 | 76(1), 70(3) | <4B | | | |
| 11C | 0.5/1.0[5] | 2190 | >200(1), >400(.3) | B | | | |
| | 1.0/1.0[5] | 590 | >200(1), >400(.3) | HB | 22.7 | 3.8 | 656 |
| | 1.5/1.0[5] | 265 | >200(1), >400(.3) | HB | | | |
| 11D | 0.5/1/0[6] | 2115 | 170(1), 120(.3) | <4B | | | |
| | 1.0/1.0[5] | 895 | >200(1), >400(.3) | B | 6.5 | 12.2 | 54 |
| | 1.5/1.0[5] | 530 | >200(1), 300(.3) | 2B | | | |
| 11E | 0.5/1.0[7] | 1980 | 46(1), 50(2) | <4B | | | |
| | 1.0/1.0[8] | 1230 | 128(1), 146(2) | <4B | 5.4 | 24.9 | 21.8 |
| | 1.5/1.0[8] | 760 | 78(1), 100(2) | <4B | | | |
| 11F | 0.5/1.0[6] | 790 | 110(1) | <4B | | | |
| | 1.0/1.0[5] | 400 | >300(1) | <4B | 4.0 | 10.0 | 41.2 |
| | 1.5/1.0[5] | 260 | 190(1) | <4B | | | |

[1]Saturated polyester having maleate end groups.
[2]The cured coating exhibited no tack at a cure dose of 1 J/sqcm.
[3]The viscosity was reduced using 20 weight percent of DVE-3/diethyl fumarate in an equivalent ratio of 1:1.
[4]The viscosity was reduced using 40 weight percent of DVE-3/diethyl fumarate in an equivalent ratio of 1:1. This was a poor film.
[5]The cured coating exhibited no tack.
[6]The cured coating exhibited slight tack at a cure dose of 1 J/sqcm.
[7]The cured coating exhibited tack.
[8]The cured coating exhibited very slight tack.

COMPARATIVE EXAMPLE 18: Preparation and Evaluation of Unsaturated Polyesters with Varying Equivalent Weight A series of unsaturated polyesters were prepared by substituting succinic anhydride for a portion of the maleic anhydride as a method of increasing the equivalent weight of the unsaturated polyester (UPE). The UPE's were prepared by standard methods using butyl stanoic acid (Fascat 4100) as the catalyst and removing the water of condensation with a xylene azeotrope. After reaching the desired acid value the xylene was When the physical properties of these examples of conventional UPEs formulated with a vinyl ether are compared with those of the practical examples of primary fiber optic coatings (Example 11, Table II), secondary fiber optic coatings (Example 11, Table III), coatings for rubber (Example 13, Table VII) and additional examples of maleate terminated systems (Example 17, Table XII), it is clear that conventional UPE systems will be of little practical value. Furthermore, attempts to flexibilize the brittle UPE A containing internal double bonds by incorporating succinic acid (UPE C) results in a reduced cure rate compared to maleate-terminated systems (Example 17, Table XII).

COMPARATIVE Evaluation of Unsaturated Polyesters with EXAMPLE 19: Varying Molecular Weights This Example illustrates the effect of having maleate groups on the backbone, rather than on the end of the molecule. A series of unsaturated polyesters were prepared by varying the ratio of maleic anhydride to 1,5-pentane diol as a method of increasing the molecular weight of the unsaturated polyester (UPE). The UPE's were prepared by standard methods using butyl stanoic acid (Fascat 4100) as the catalyst and removing the water of condensation with a xylene azeotrope. After reaching the desired acid value, the xylene was removed. The compositions prepared and their properties are summarized below.

|  | UPE A | UPE B | UPE C | UPE D |
|---|---|---|---|---|
| Reactant | | | | |
| Maleic Anhydride | 43.0% | 44.7% | 46.6% | 47.6% |
| 1,5-Pentane diol | 57.0% | 55.3% | 53.4% | 52.4% |
| Properties | | | | |
| Mole Ratio (1,5-P/MA) | 1.25 | 1.17 | 1.08 | 1.04 |
| Viscosity (cP) | 3340 | 6100 | 23,400 | 40,080 |
| Acid Value | 7.5 | 9.4 | 9.8 | 21.7 |
| Double Bond Eq. Wt. | 210 | 201 | 192 | 188 |
| Molecular Wt. (calc) | 754 | 1008 | 1698 | 1673 |

The UPE's shown above were formulated with DVE-3 at a 1:1 ratio of maleate double bond to vinyl ether double bond and Darocur 1173 was used as the photoinitiator. Films (3 mil) were prepared and cured at 1 J/cm$^2$ on glass. The films could be removed from the glass substrate but were to brittle for testing in the Instron. All attempts to mount these films in the jaws of the machine resulted in destruction of the film and no tensile, elongation or modulus data should be obtained.

COMPARATIVE Formulation of Various Coating EXAMPLE 20: Compositions

The following formations were prepared for evaluation as coating compositions. Formulations A and B represent an attempt to cure vinyl ether oligomers using conventional free radical photoinitiators.

| Compositions | | UV Cure Results at a dose of 3 J/cm$^2$ |
|---|---|---|
| A. Product of Example 9 | 100% | A wet, very tacky film having 2 MEK |
| Darocur 1173 | 4% | double rubs was obtained. |
| B. Product of Example 9 | 100% | A wet, very tacky film having 2 MEK |
| Lucerin TPO | 4% | double rubs was obtained. |
| Formulations C and D are representative of the cure of maleate compounds blended with vinyl ether compounds in a 1:1 ratio of maleate groups to vinyl ether groups. | | |
| C. Product of Example 9 | 51.1% | A fully cured film having >200 MEK |
| Desolite 1115[1] | 22.3% | double rubs was obtained. |
| Product of Example 1 | 20% | |
| Darocur 1173 | 4% | |
| D. Product of Example 10 | 42.3% | A fully cured film having >200 MEK |
| Desolite 1110[2] | 17.7% | double rubs was obtained. |
| DEM[3] | 18.9% | |
| DVE-3 | 11.1% | |
| Product of Example 1 | 10% | |
| Darocur 1173 | 4% | |
| Formulations E and F represent an attempt to cure maleate ester oligomers using conventional free radical photoinitiators. | | |
| E. Desolite 1110[2] | 100% | A wet, very tacky film having 1 MEK |
| Darocur 1173 | 4% | double rubs was obtained. |
| F. Desolite 1115[1] | 100% | A wet, very tacky film having 3 MEK |
| Lucerin TPO | 4% | double rubs was obtained. |

[1] A maleate-terminated saturated oligomer prepared from 32.19 weight percent maleic anhydride, 42.74 weight percent 2-ethylhexanol, 22.02 weight percent dipropylene glycol, 0.10 weight percent Fascat 4100 catalyst from M & T Chemicals and 2.95 weight percent xylene.
[2] A maleate-terminated saturated oligomer prepared from 31.04 weight percent maleic anhydride, 52.34 weight percent butyl carbitol, 16.62 weight percent 1,5-pentanediol, 0.10 weight percent Fascat 4100 catalyst and 3 weight percent xylene.
[3] Diethyl maleate.

This Example dramatically demonstrates three important results. First, that vinyl ether oligomers alone do not cure to give films of practical utility when exposed to practical doses of LFV light in the presence of conventional free radical photoinitiators. Secondly, this Example shows that simple maleate oligomers give films of no practical utility when exposed to practical doses of UV light in the presence of free radical photoinitiators. Finally, this Example shows that when the components of the two non-useful formulations are properly formulated in the presence of free radical photoinitiators, fully cured films having practical utility are obtained at a practical cure dosage.

EXAMPLE 21: Compositions Containing

A flask was fitted with a variable speed stirrer, thermometers, a snyder column, a condenser with a trap, a nitrogen sparge and a heating mantle. One equivalent of the non-polyester backbone containing component of the saturated reactant, and one mole of maleic anhydride were introduced into the flask. The contents of the flask was heated to a temperature of 60° C. and held at that temperature for a time period effective to obtain a constant acid value (about 2 hours). The flask was then charged with 0.1% benzyltrimethylammonium chloride. The addition funnel was charged with two equivalents, i.e., twice the amount necessary for a 1:1 equivalents ratio, of propylene oxide which was introduced into the flask over a time period of 1 to 2 hours as necessary to maintain a slow reflux. When all of the propylene oxide had been added, the temperature of the contents was increased, as necessary, to maintain a slow reflux of propylene oxide. When the contents reached a temperature of 100° C., they were maintained at that temperature for a time period (about 4 to 10 hours) sufficient to obtain an acid value of less than 10. The excess propylene oxide was collected at 100° C. at a reduced pressure. The product was the saturated reactant.

Alternatively, the saturated reactant was prepared by reacting the non-polyester backbone containing component with either the butyl cellosolve ester of maleic acid which had been reacted with propylene oxide or the butyl cellosolve half ester of maleic acid.

The compositions and performance characteristics of representative compositions containing the saturated reactants utilized in this Example are provided in TABLE XIII.

ratios as indicated in TABLE XIII. The compositions were drawn down as a film on an unprimed aluminum substrate. The test results are presented in TABLE XIII.

EXAMPLE 22: Compositions of the Present Invention

Compositions were prepared and tested. Each composition comprised a (meth)acrylate oligomer and at least one vinyl ether or maleate/fumarate compound and the compound of EXAMPLE 1. The formulations of the compositions are presented in TABLE XIV.

TABLE XIV

| Component | Equivalent wt. | Compositions |  |  |  |  |  |  |  |  |
|---|---|---|---|---|---|---|---|---|---|---|
|  |  | A | B | C | D | E | F | G | H | I |
| Oligomer 1[1] | 608 | 83.3 | 60.8 | 73.4 | — | — | — | — | — | — |
| Oligomer 2[2] | 2030 | — | — | — | 92.4 | 81.9 | 82.9 | — | — | — |
| Oligomer 3[3] | 2829 | — | — | — | — | — | — | 80.3 | — | — |
| Cargill 15703[4] | Unreported | — | — | — | — | — | — | — | 75.0 | 75.0 |
| DVE-3[5] | 101 | 13.8 | 10.1 | 16.3 | 4.6 | 8.2 | 4.1 | 2.9 | 8.0 | 2.5 |
| Diethyl maleate | 172 | — | — | 6.9 | — | 6.9 | — | — | 13.6 | 4.3 |
| Monomer[6] | 243 | — | 26.1 | — | — | — | 9.9 | 13.8 | — | 14.8 |
| Photoinitiator[7] | 204 | 2.9 | 3.0 | 3.4 | 3.0 | 3.0 | 3.1 | 3.0 | 3.4 | 3.4 |

[1]The (meth)acrylate oligomer 1 of this Example.
[2]The (meth)acrylate oligomer 2 of this Example.
[3]The (meth)acrylate oligomer 3 of this Example.
[4]An acylate oligomer that is a diacrylate ester of Bisphenol A epichlorohydrin epoxide resin and is commercially available from Cargill, Carpentersville, IL.
[5]Triethyleneglycol divinyl ether commercially available from GAF under the trade designation Rapicure DVE-3.
[6]The compound of EXAMPLE 1.
[7]Irgacure 184, commercially available from Ciba-Geigy Corp. Ardsley, NY.

TABLE XIII

|  | I | II | III |
|---|---|---|---|
| 11B[1] | 91.7 | 84.6 | 78.6 |
| DVE-3 | 8.3 | 15.4 | 21.4 |
| Darocur 1173 | 4.0 | 4.0 | 4.0 |
| Phenothiazine | 0.2 | 0.2 | 0.2 |
| MA/VE Ratio | 2/1 | 1/1 | 2/3 |
| Viscosity | 9050 | 3555 | 2080 |
| MEK Double Rubs |  |  |  |
| 1 J/cm² | 130* | 85* | 37* |
| 2 J/cm² | >200* | 118* | 60* |
| Pencil Hardness (2 J/cm²) | 4B | <4B | <4B |
| Tensile (MPa) | — | 0.34 | — |
| Elongation | — | 13.0 | — |
| Modulus (MPa) | — | 2.6 | — |

*Tacky surface
[1]A polybutadiene diol that has an equivalent weight of about 800 and is available from Nissho Iwai American Corp. under the designation NISSO PB GI 1000.

The compositions were prepared utilizing the saturated reactants of this EXAMPLE and the photoinitiator Durocur 1173 at 4.0 wt % and the stabilizer phenothiazine at 0.2 wt %. Each composition utilized DVE-3 to vary vinyl ether to maleate/fumarate (VE/MA)

(Meth)acrylate oligomer 1 was prepared by reacting 80.8 weight percent Adiprene L-200 commercially available from Uniroyal, Middlebury, Conn., 0.1 weight percent of dibutyltin dilaurate, 0.1 weight percent butylated hydroxy toluene and 19 weight percent 2-hydroxyethyl acrylate.

(Meth)acrylate oligomer 2 was prepared by reacting 3 mols of IDPI and 3 mols of 2-hydroxyethyl acrylate which was then reacted with 1 mol of Jeffamine T5000, commercially available from Texaco Chemical.

(Methyl)acrylate oligomer 3 was prepared by reacting 18.65 weight percent Desmodur W, commercially available from Miles Chemical Co., 0.01 weight percent $P_2N$, 0.03 weight percent butylated hydroxy toluene, 0.07 weight percent dibutyltin dilaurate and 35.9 weight percent NIAX PPG 1025 commercially available from Union Carbide which was then reacted with 4 weight percent hydroxyethyl acrylate which was then reacted with 30 weight percent phenoxyethyl acrylate, 7.3 weight percent N-vinyl pyrrolidone available from 150 and 4 weight percent Jeffamine D230 commercially available from Texaco Chemical.

The results for tests conducted on Compositions A to I, and cured films prepared therefrom, are presented in TABLE XV. The test procedures are presented after TABLE XV.

TABLE XV

| Property | Test Results |  |  |  |  |  |  |  |  |
|---|---|---|---|---|---|---|---|---|---|
|  | Composition: |  |  |  |  |  |  |  |  |
|  | A | B | C | D | E | F | G | H | I |
| Appearance | water white | yellow, clear | water white | clear, very slight haze | clear, very slight haze | yellow, very slight haze | yellow, clear slight haze | straw, very | yellow, clear |
| Viscosity (cP) | 12,200 | 2100 | 9200 | 8750 | 2900 | 4700 | 5000 | 8500 | 19,100 |
| Tensile Properties |  |  |  |  |  |  |  |  |  |

TABLE XV-continued

| | Test Results | | | | | | | | |
|---|---|---|---|---|---|---|---|---|---|
| | Composition: | | | | | | | | |
| Property | A | B | C | D | E | F | G | H | I |
| Tensile (MPA) | 9.4 | 13 | 10 | 2.3 | 2.0 | 2.5 | 6.2 | 32 | 37 |
| Elongation (%) | 48 | 34 | 49 | 75 | 51 | 53 | 71 | 3.3 | 3.0 |
| Modulus (MPa) | 25 | 61 | 24 | 3.7 | 3.6 | 4.9 | 7.7 | 933 | 1113 |
| Water absorption (%) | −2.8 | −1.4 | −2.5 | −1.4 | −3.6 | −1.0 | −0.5 | +1.9 | ND[1] |
| Water extractables (%) | −4.8 | −2.8 | −4.7 | −1.9 | −4.1 | −2.1 | −2.7 | −0.7 | ND |

[1]ND = Not determined.

The films, cured at a dosage of 1 Joule per square centimeter, prepared from Compositions A to I exhibited no odor. Films prepared from Compositions A, B and C were clear and exhibited no tack and good adhesion and toughness. Films prepared from Compositions D, E and F exhibited slight tack. Film prepared from Composition G exhibited slight tack, good toughness and fair adhesion. Films prepared from Compositions H and I exhibited no tack, were strong and stiff films.

EXAMPLE 23

The following representative formulations were prepared and evaluated as coating compositions:

| Compositions | | Results |
|---|---|---|
| A. Oligomer 1, Example 22 | 100% | >200 MEK Double Rubs at 3 J/cm² and |
| Darocur 1173 | 4% | 87% adhesion to unprimed aluminum. |
| B. Oligomer 1, Example 22 | 100% | >200 MEK Double Rubs at 3 J/cm² and |
| Lucrin TPO | 4% | 83% adhesion to unprimed aluminum. |
| Compositions C and D are examples of (meth)acrylate oligomers formulated into coating systems that contain maleate oligomers, vinyl ether oligomers and the compound of Example 1. | | |
| C. Oligomer 1, Example 22 | 50.0% | >200 MEK Double Rubs at 3 J/cm² and |
| Product of Example 9 | 23.7% | 44% adhesion to unprimed aluminum. |
| DVE-3 | 5.9% | |
| DEM | 10.4% | |
| Product of Example 1 | 10.0% | |
| Darocur 1173 | 4.0% | |
| D. Oligomer 1, Example 22 | 50.0% | >200 MEK Double Rubs at 3 J/cm² and |
| Product of Example 10 | 22.0% | 66% adhesion to unprimed aluminum. |
| DVE-3 | 5.4% | |
| DEM | 2.6% | |
| Product of Example 1 | 10.0% | |
| Darocur 1173 | 4.0% | |

This Example demonstrates that compositions containing 50% of a (meth) acrylate oligomer can be prepared and cured without reducing the degree of cure as measured by MEK Double Rubs.

EXAMPLE 24: Toxicity Studies

Toxicity tests were performed on commercially available (meth) acrylate oligomers and diluents and on commercially available vinyl ether and maleate diluents. The results of these toxicity tests are provided in TABLE XVI.

TABLE XVI

| | Toxicity Tests | | | | |
|---|---|---|---|---|---|
| Material | Oral LD$_{50}$ (mg./kg.) | Skin LD$_{50}$ (mg./kg.) | Inhalation Kill (animals) | Skin Irritation (max. = 8) | Eye Irritation (max. = 10) |
| ACTOMER X-70[1] | 23.8 | 16 | 0 of 6 | 2 | 1 |
| ACTOMER X-80[1] | 20 | 16 | 0 of 6 | 3 | 1 |
| Neopentylglycol diacrylate[2] | 5.19 | 0.35 | 1 of 6 | 5 | 8 |
| 2-hydroxyethyl acrylate | 0.65 | 0.14 | 1 of 6 | 6 | 9 |
| Pentaerythritol triacrylate | 2.46 | 4 | 0 of 6 | 2 | 10 |
| 2-phenoxyethyl acrylate | 4.66 | 2.54 | 0 of 6 | 3 | 1 |
| Diethyleneglycol diacrylate | 0.77 | 0.18 | 0 of 6 | 5 | 9 |
| 1,6-hexanediol diacrylate | 4.76 | 0.71 | 0 of 6 | 3 | 2 |
| divinyl ether | 7500 | 72000 | NA[3] | 0.25 | none |
| Dimethyl maleate | 1410 | 530 | NA | 5.47 | moderate |
| Diethyl maleate | 3200 | 4000 | NA | mild | mild |

TABLE XVI-continued

| | Toxicity Tests | | | | |
|---|---|---|---|---|---|
| Material | Oral LD$_{50}$ (mg./kg.) | Skin LD$_{50}$ (mg./kg.) | Inhalation Kill (animals) | Skin Irritation (max. = 8) | Eye Irritation (max. = 10) |
| Dubutyl maleate | 8530 | 16000 | NA | mild | NA |

[1]The Actomer products, commercially available from Union Carbide, are acrylate oligomers prepared by the addition of acrylic acid to epoxidized soy or linseed oils. These are relatively high molecular weight materials containing up to three to six acrylic groups respectively per molecular.
[2]Neopentylglycol diacrylate was found to be an experimental tumor causing agent.
[3]NA = Not available.

The skin irritation and eye irritation tests were conducted according to the procedure to categorize the compositions under the Federal Hazardous Substance Labeling Act (16 C.F.R. §1500).

A composition representing the present invention (Composition J) was tested for skin irritation and eye irritation. The test results are presented in TABLE XVII, below.

TABLE XVII

| Toxicity Study of Compositions | | |
|---|---|---|
| Composition | Skin irritation (PI)[1] | Eye irritation |
| J | 1.8 | non-irritant |

[1]PI = Primary irritation index. A PI of 1.8 indicates the composition of the present invention (Composition J) is only a mild irritant.

TABLE XVII indicates that the present compositions result in a significant reduction in irritation as compared to conventional (meth)acrylate compositions.

The reactant, a branched maleate terminated ester, of Composition J was prepared utilizing a glass flask equipped with a reflux condenser, Dean-Stark tube for azetropic separation of water, a heating mantle, a thermometer, and a mechanical stirrer. A mixture of maleic anhydride (0.8 mols) and butyl carbitol (0.84 mols) was heated in the flask to 80° C. An exothermic reaction occurred and the temperature rose to 120° C. where it was held for a time period of 2 hours. Trimethylol propane (0.23 mols), 1,5-pentane diol (0.3 mols), azelaic acid (0.2 mols), Fascat 4100 a catalyst commercially available from M & T Chemical Co. (0.3%) and 40 ml of xylene were then added to the flask. The contents of the flask were heated and stirred while the water of reaction was removed by azetropic distillation. When an acid value of 16.5 was reached, the xylene was distilled out. The resulting branched maleate terminated ester had a Brookfield viscosity of 392 cP.

Composition J comprised Ebecryl 8805, a urethane acrylate oligomer commercially available from Radcure, Inc., Louisville, Ky. (40 parts), Rapi-Cure DVE-3, commercially available from ISP (14.7 parts), the maleate terminated ester described above (55.9 parts), Darocur 1173, commercially available from E & M Company (5.0 parts), and Phenothiazine, commercially available from Eastman (0.2 parts) were blended together at room temperature under yellow safety lights until homogeneous. The resultant Composition J had a viscosity of 1,830 cP, a weight per gallon of 8.6 pounds, and a closed cup flash point of greater than 212° F.

Composition J was drawn down on a paper sheet with a #20 wire wound rod, placed on a U.V. cure apparatus (commercially available from Fusion Systems) to cure. At an exposure of 1 Joule/square centimeter, the resultant coating was completely cured (125+ MEK Double rubs) with a tough hard surface. The same coating cured with 5 megarads of electron beam exposure. Removal of the Darocur 1173 from Composition J permitted much lower electron beam doses for total cure (about 2-3 megarads).

EXAMPLE 25: Acute Toxicity Studies

A composition of the present invention and a conventional acrylate composition were tested to determine eye irritation and primary skin irritation. The eye irritation study and the primary skin irritation study were conducted according to the procedure to categorize the compositions under the Federal Hazardous Substance Labeling Act (16 C.F.R. §1500).

The composition of the present invention included a polyester having maleate end groups and a vinyl ether. This composition resulted in no eye irritation and only moderate skin irritation, i.e., a Primary Irritation Index (PI) of 2.7. The PI is a measure of skin irritation that goes up to a value of 10. A PI of 10 indicates a composition that is a severe irritant.

The compositions of the present invention are less toxic than many conventional all acrylate compositions.

EXAMPLE 26: Paper Coating Compositions

Compositions suitable as paper coating compositions were prepared and tested. The formulations of these compositions are presented in TABLE XVIII.

TABLE XVIII

| Paper Coating Compositions | | | |
|---|---|---|---|
| | Composition (wt): | | |
| Component | 1 | 2 | 3 |
| Reactant[1] | 63.9 | 63.9 | 63.9 |
| DVE-3[2] | 23.0 | 23.0 | 23.0 |
| Diethyl maleate | 13.1 | 13.1 | 13.1 |
| Photoinitiator[3] | 7.0 | 7.0 | 7.0 |
| Phenothiazine | 0.1 | 0.1 | 0.1 |
| N-vinyl pyrrolidone | 5.0 | — | — |
| DEA[4] | 4.0 | 4.0 | 4.0 |
| AM 1908[5] | — | 10 | — |
| DC 57[6] | 0.5 | 0.5 | 0.5 |

[1]The product of the reaction of trishydroxyethyl isocyanurate with the butyl carbitol ester of maleic anhydride (Example 121).
[2]Triethyleneglycol divinyl ether commercially available from ISP Corp. under the trade designation Rapi-Cure DVE-3.
[3]Darocur 1173, commercially available from E-M Company, Hawthorne, NY.
[4]Diethyl amine.
[5]An acrylate-terminated melamine derivative commercially available from Monsanto under the trade designation Santolink AM 1908.
[6]A surfactant available from Dow Corning.

The Compositions 1 to 3, and films produced therefrom, were tested. The test results are provided in TABLE XIX.

TABLE XIX

| Test Results | | | |
|---|---|---|---|
| | Composition: | | |
| Property | M | N | O |
| Viscosity (cP) | 140 | 240 | 210 |
| Adhesion to Paper Substrate: | | | |

TABLE XIX-continued

| Property | Composition: | | |
|---|---|---|---|
|  | M | N | O |
| 610 | 100 | 100 | 100 |
| 610 crosshatch | 95 | 85 | 95 |
| Scotch | 100 | 95 | 100 |
| MEK Double Rubs cure dose: | | | |
| 0.5 J/sqcm | 64 | 100 | 69 |
| 1 J/sqcm | 60 | 107 | 85 |

The results procedure for determination of the viscosity has been discussed previously.

The adhesion to a paper substrate tests were similar to the previously discussed adhesion test. The cure dose for these adhesion tests was 0.5 J/sqcm. Furthermore, a third adhesion test was conducted using scotch tape on an uncross-hatched film.

The MEK Double Rubs test was conducted on a film cured to an aluminum Q panel.

We claim:

1. A free-radical radiation curable composition comprising:
   a) at least one compound containing from one to about six vinyl ether groups; and
   b) at least one compound containing a saturated ester or polyester backbone and at least one maleate and/or fumarate end group per molecule,
   wherein the ratio of vinyl ether groups to maleate and/or fumarate groups in the composition is in the range of about 2:1 to about 1:2.

2. The composition of claim 1 that further comprises a compound containing at least one vinyl ether and at least one maleate or fumarate end group.

3. The composition of claim 1 wherein the compound containing at least one vinyl ether group has a number average molecular weight of about 150 to about 8000 and the compound containing a saturated ester or polyester backbone has a number average molecular weight of about 100 to about 5000.

4. The composition of claim 1 wherein the compound containing at least one vinyl ether group has the formula:

$$R^3-(O-CH=CHR^4)_m$$

where m is an integer from 1 to 5;
R$^3$ is a residue of an organic alcohol or polyol, essentially free of maleate or fumarate groups, with a molecular weight of from 56 to about 2000; and
R$^4$ is hydrogen or methyl.

5. The composition of claim 4 wherein the value of m is 2 to 4.

6. The composition of claim 1 wherein component b has the formula:

$$R^1-(O-\overset{O}{\overset{\|}{C}}-CH=CH-\overset{O}{\overset{\|}{C}}-O-R^2)_n$$

where n is an integer from 1 to 5;
R$^1$ is the residue of an organic alcohol or polyol, essentially free of maleate, fumarate, or urethane groups, with a molecular weight of from 15 to about 2000; and R$^2$ is hydrogen, alkyl, cycloalkyl, or aryl or alkaryl, with 1 to 15 carbon atoms and at least one optional O or N heteroatom, or a metal iron.

7. The composition of claim 6 wherein R$^1$ is the residue of a hydroxy terminated saturated polyester.

8. The composition of claim 6 wherein the value of n is 2 to 4.

9. The composition of claim 6 wherein
R$^2$ is CH$_3$(CH$_2$)$_x$—(—O—CH$_2$CHR$^8$)$_y$— where x is 0 to 5;
Y is 0 to 3; and
R$^8$ is hydrogen or methyl.

10. The composition of claim 6 wherein n is 2
R$^1$ is —(CH$_2$)$_p$-CHR$^9$—]O—(CH$_2$)$_p$—CHR$^9$—]$_q$—
where p is an integer from 1 to 5;
q is an integer from 0 to 20; and
R$^9$ is hydrogen or methyl.

11. The composition of claim 1 wherein the ratio of vinyl ether groups to maleate and/or fumarate groups is about 1:1.

12. The composition of claim 1 that further comprises 0.1 to 10 weight percent based on the total weight of the composition of at least one free radical photoinitiator.

13. The composition of claim 12 wherein the photoinitiator is

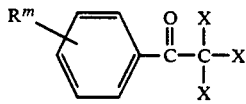

where R$^m$ is an optional alkyl or aryl hydrocarbon substitutent containing from 1 to 10 carbon atoms, and
x is selected from the group consisting of hydroxy, C$_1$ to C$_4$ alkyoxy, C$_1$ to C$_8$ alkyl, cycloalkyl, halogen, and phenyl, or 2 Xs together are cycloalkyl, and at least one X is selected from the group consisting of hydroxy and C$_1$ to C$_4$ alkoxy.

14. The composition of claim 12 wherein the photoinitiator is

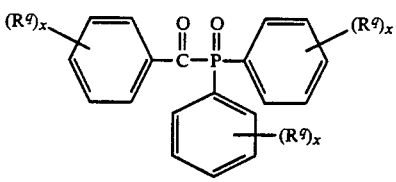

where R$^q$ is an optional hydrocarbon substitutent containing from 1 to 10 carbon atoms; and
x is independently an integer from 1 to 3.

15. A compound of the formula:

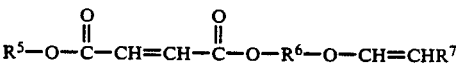

$$R^5-O-\overset{O}{\overset{\|}{C}}-CH=CH-\overset{O}{\overset{\|}{C}}-O-R^6-O-CH=CHR^7$$

where R$^5$ is hydrogen, alkyl, cycloalkyl, an aryl or alkaryl group with 1 to 10 carbon atoms and at least one optional O or N heteroatom, or a metal ion;
R$^6$ is alkyl, cycloalkyl, or an aryl or alkaryl group with 1 to 10 carbon atoms and at least one optional O or N heteroatom; and
R$^7$ is hydrogen or methyl.

16. The composition of claim 1 that further comprises up to about 80 weight percent based on the total weight of the composition of a dual functional monomer of the formula:

$$R^5-O-\overset{O}{\underset{\|}{C}}-CH=CH-\overset{O}{\underset{\|}{C}}-O-R^6-O-CH=CHR^7$$

where $R^5$ is hydrogen, alkyl, cycloalkyl, an aryl or alkaryl group, with 1 to 10 carbon atoms and an optional O or N heteroatom, or a metal ion;

$R^6$ is alkyl, cycloalkyl, or an aryl or alkaryl group with 1 to 10 carbon atoms and at least one optional O or N heteroatom; and $R^7$ is hydrogen or methyl.

17. The composition of claim 1 that further comprises up to about 40 percent based on the total weight of the composition by weight of at least one additive selected from the group consisting of pigments, fillers, wetting agents, stabilizers and combinations thereof.

18. The composition of claim 1 wherein the compound containing the vinyl ether group is triethyleneglycol divinyl ether.

19. The composition of claim 1 wherein the compound containing the vinyl ether group is 1,4-cyclohexane dimethanol divinyl ether.

20. The composition of claim 1 wherein the compound containing the vinyl ether group is a vinyl ether terminated urethane oligomer.

21. The composition of claim 1 that further comprises up to 50 weight percent based on the total weight of the composition of acrylate or methacrylate terminated monomers or oligomers with equivalent weights ranging from about 250 to 5000 and average functionalities from about 1 to 4.

22. A substrate coated with a composition of claim 1.

23. A substrate coated with a cured composition of claim 1.

24. The coated substrate in accordance with claim 22 or 20, wherein the substrate is selected from the group of glass, paper, wood, rubber, metal, concrete leather, fabric, fiber and plastic.

25. A free-radical radiation curable composition comprising:

(a) at least one vinyl ether compound of the formula:

$$R^3-(O-CH=CHR^4)_m$$

where m is an integer from 1 to 5;

$R^3$ is the residue of an organic alcohol or polyol, essentially free of maleate or fumarate groups, with a molecular weight of from 50 to about 2,000; and $R^4$ is hydrogen or methyl; and (b) at least one compound of the formula:

$$R^1-(O-\overset{O}{\underset{\|}{C}}-CH=CH-\overset{O}{\underset{\|}{C}}-O-R^2)_n$$

where n is an integer from 1 to 5;

$R^1$ is the residue of an organic alcohol or polyol, essentially free of maleate, fumarate or urethane groups, with a molecular weight of from 15 to about 2,000; and $R^2$ is hydrogen, alkyl, cycloalkyl, aryl or alkenyl having 1 to 15 carbon atoms and at least one optional O or N heteroatom, or a metal ion;

wherein the ratio of vinyl ether groups to maleate and/or fumarate groups in the composition is in the range of about 2:1 to about 1:2.

26. A composition as in claim 25 where n is an integer from 2 to 4.

* * * * *

UNITED STATES PATENT AND TRADEMARK OFFICE
CERTIFICATE OF CORRECTION

PATENT NO. : 5,334,456
DATED : August 2, 1994
INVENTOR(S) : Noren et al

It is certified that error appears in the above-indentified patent and that said Letters Patent is hereby corrected as shown below:

Cover Page, Assignee: delete [B.V., Galeen, Netherlands] and insert --B.V., Geleen, Netherlands--.

Column 1, line 60, delete [Go] and insert --do--.

Column 5, line 52, after "Containing" insert --Compound--.

Column 8, line 14, delete [Diluent] and insert --Diluents--.

UNITED STATES PATENT AND TRADEMARK OFFICE
CERTIFICATE OF CORRECTION

PATENT NO. : 5,334,456
DATED : August 2, 1994
INVENTOR(S) : Noren et al

It is certified that error appears in the above-indentified patent and that said Letters Patent is hereby corrected as shown below:

Column 18, line 1, delete [preferably] and insert --preferable--.

Column 27, line 3, delete [COMPARATIVE Evaluation of Unsaturated Polyesters with EXAMPLE 19: Varying Molecular Weights] and insert --COMPARATIVE EXAMPLE 19: Evaluation of Unsaturated Polyesters with Varying Molecular Weights--.

Column 27, line 65, delete [to] and insert --too--.

Column 28, line 1, delete [COMPARATIVE Formulation of Various Coating EXAMPLE 20: Compositions] and insert --COMPARATIVE EXAMPLE 20: Formulation of Various Coating Compositions--.

UNITED STATES PATENT AND TRADEMARK OFFICE
CERTIFICATE OF CORRECTION

PATENT NO. : 5,334,456
DATED : August 2, 1994
INVENTOR(S) : Noren et al

It is certified that error appears in the above-indentified patent and that said Letters Patent is hereby corrected as shown below:

Column 28, line 40, delete [LFV] and insert --UV--.

Column 28, line 51, after "Containing" insert --Saturated Reactant--.

Column 30, Table XIV, Footnote 4, delete [acylate] and insert --acrylate--

Column 31, Example 23, Part D, delete

[D. Oligomer 1, Example 22    50.0%  >200 MEK Double Rubs at 3 J/cm$^2$ and

Product of Example 10   22.0%  66% adhesion to unprimed aluminum.

DVE-3                    5.4%

DEN                      2.6%

Product of Example 1    10.0%

Darocur 1173             4.0%]

UNITED STATES PATENT AND TRADEMARK OFFICE
CERTIFICATE OF CORRECTION

PATENT NO. : 5,334,456
DATED : August 2, 1994
INVENTOR(S) : Noren et al.

It is certified that error appears in the above-indentified patent and that said Letters Patent is hereby corrected as shown below:

Column 32 and 33, Table XVI, delete

TABLE XVI

Toxicity Tests

| Material | Oral $LD_{50}$ (mg./kg.) | Skin $LD_{50}$ (mg./kg.) | Inhalation Kill (animals) | Skin Irritation (max. = 8) | Eye Irritation (max. = 10) |
|---|---|---|---|---|---|
| ACTOMER X-70[1] | 23.8 | 16 | 0 of 6 | 2 | 1 |
| ACTOMER X-80[1] | 20 | 16 | 0 of 6 | 3 | 1 |
| Neopentylglycol diacrylate[2] | 5.19 | 0.35 | 1 of 6 | 5 | 8 |
| 2-hydroxyethyl acrylate | 0.65 | 0.14 | 1 of 6 | 6 | 9 |
| Pentaerythritol triacrylate | 2.46 | 4 | 0 of 6 | 2 | 10 |
| 2-phenoxyethyl acrylate | 4.66 | 2.54 | 0 of 6 | 3 | 1 |
| Diethyleneglycol diacrylate | 0.77 | 0.18 | 0 of 6 | 5 | 9 |
| 1,6-hexanediol diacrylate | 4.76 | 0.71 | 0 of 6 | 3 | 2 |
| divinyl ether | 7500 | 72000 | NA[3] | 0.25 | none |
| Dimethyl maleate | 1410 | 530 | NA | 5.47 | moderate |
| Diethyl maleate | 3200 | 4000 | NA | mild | mild |

UNITED STATES PATENT AND TRADEMARK OFFICE
CERTIFICATE OF CORRECTION

PATENT NO. : 5,334,456

DATED : August 2, 1994

INVENTOR(S) : Noren et al

It is certified that error appears in the above-indentified patent and that said Letters Patent is hereby corrected as shown below:

and insert
:

--D. Oligomer 1, Example 22    50.0%  >200 MEK Double Rubs at 3 J/cm$^2$ and

Product of Example 10   22.0%  66% adhesion to unprimed aluminum.

DVE-3                    5.4%

Dexolite 1110 (See Ex. 20)  10.0

DEN                      2.6%

Product of Example 1    10.0%

Darocur 1173             4.0%--.

UNITED STATES PATENT AND TRADEMARK OFFICE
CERTIFICATE OF CORRECTION

PATENT NO. : 5,334,456
DATED : August 2, 1994
INVENTOR(S) : Noren et al.

It is certified that error appears in the above-indentified patent and that said Letters Patent is hereby corrected as shown below:

33
TABLE XVI-continued

| Material | Toxicity Tests | | | | |
| --- | --- | --- | --- | --- | --- |
| | Oral LD$_{50}$ (mg./kg.) | Skin LD$_{50}$ (mg./kg.) | Inhalation Kill (animals) | Skin Irritation (max. = 8) | Eye Irritation (max. = 10) |
| Dibutyl maleate | 8530 | 16000 | NA | mild | NA |

*The Actomer products, commercially available from Union Carbide, are acrylate oligomers prepared by the addition of acrylic acid to epoxidized soy or linseed oils. These are relatively high molecular weight materials containing up to three to six acrylic groups respectively per molecule.
²Neopentylglycol diacrylate was found to be an experimental tumor causing agent.
³NA = Not available.

UNITED STATES PATENT AND TRADEMARK OFFICE
CERTIFICATE OF CORRECTION

PATENT NO. : 5,334,456
DATED : August 2, 1994
INVENTOR(S) : Noren et al.

It is certified that error appears in the above-indentified patent and that said Letters Patent is hereby corrected as shown below:

and insert —

TABLE XVI
Toxicity Tests

| Material | Oral LD$_{50}$ (gm./kg.) | Skin LD$_{50}$ (gm./kg.) | Inhalation Kill (animals) | Skin Irritation (max.=8) | Eye Irritation (max.=10) |
|---|---|---|---|---|---|
| ACTOMER X-70[1] | 23.8 | .16 | 0 of 6 | 2 | 1 |
| ACTOMER X-80[1] | 20 | .16 | 0 of 6 | 3 | 1 |
| Neopentyl-glycol diacrylate[2] | 3.19 | 0.35 | 1 of 6 | 5 | 8 |
| 2-hydroxy-ethyl acrylate | 0.45 | 0.14 | 1 of 6 | 6 | 9 |
| Pentaery-thritol triacrylate | 2.46 | 4 | 0 of 6 | 2 | 10 |
| 2-phenoxyethyl acrylate | 4.66 | 2.54 | 0 of 6 | 3 | 1 |
| Diethylene-glycol diacrylate | 0.77 | 0.13 | 0 of 6 | 5 | 9 |
| 1,6-hexanediol diacrylate | 4.76 | 0.71 | 0 of 6 | 3 | 2 |

UNITED STATES PATENT AND TRADEMARK OFFICE
CERTIFICATE OF CORRECTION

PATENT NO. : 5,334,456
DATED : August 2, 1994
INVENTOR(S) : Noren et al

Page 8 of 10

It is certified that error appears in the above-indentified patent and that said Letters Patent is hereby corrected as shown below:

| | | | | | |
|---|---|---|---|---|---|
| Triethylene-glycol divinyl ether | 7500 | 72000 | NA[3] | 0.25 | rare |
| Dimethyl maleate | 1410 | 530 | NA | 3.47 | moderate |
| Diethyl maleate | 3200 | 4000 | NA | mild | mild |
| Dibutyl maleate | 8530 | 16000 | NA | mild | NA |

[1] The Actomer products, commercially available from Union Carbide, are acrylate oligomers prepared by the addition of acrylic acid to epoxidized soy or linseed oils. These are relatively high molecular weight materials containing up to three to six acrylic groups respectively per molecule.

[2] Neopentylglycol diacrylate was found to be an experimental tumor causing agent.

[3] NA = Not available. —

UNITED STATES PATENT AND TRADEMARK OFFICE
CERTIFICATE OF CORRECTION

PATENT NO. : 5,334,456
DATED : August 2, 1994
INVENTOR(S) : Noren et al

It is certified that error appears in the above-indentified patent and that said Letters Patent is hereby corrected as shown below:

Column 35, line 14, delete [results] and insert --test--.

Column 36, line 1, delete [or] (first occurence) and insert --an--.

Column 36, line 15, delete $[-(CH_2)_p-CHR^9-]O-(CH_2)_p-CHR^9-]_q-]$ and insert -- $-(CH_2)_p-CHR^9-[O-(CH_2)_p-CHR^9-]_q-$ --.

UNITED STATES PATENT AND TRADEMARK OFFICE
CERTIFICATE OF CORRECTION

PATENT NO. : 5,334,456
DATED : August 2, 1994
INVENTOR(S) : Noren et al

It is certified that error appears in the above-indentified patent and that said Letters Patent is hereby corrected as shown below:

Column 38, Claim 24, delete [22 or 20] and insert --22 or 23--.

Signed and Sealed this

Thirty-first Day of January, 1995

Attest:

BRUCE LEHMAN

Attesting Officer

Commissioner of Patents and Trademarks